United States Patent [19]

Swainson et al.

[11] 4,288,861
[45] Sep. 8, 1981

[54] THREE-DIMENSIONAL SYSTEMS

[75] Inventors: Wyn K. Swainson, Berkeley; Stephen D. Kramer, Oakland, both of Calif.

[73] Assignee: Formigraphic Engine Corporation, San Francisco, Calif.

[21] Appl. No.: 5,259

[22] Filed: Jan. 22, 1979

Related U.S. Application Data

[63] Continuation-in-part of Ser. No. 856,434, Dec. 1, 1977, which is a continuation-in-part of Ser. No. 544,480, Jan. 27, 1975, Pat. No. 4,078,229.

[51] Int. Cl.$^3$ .................. G11C 11/42; G11C 13/04
[52] U.S. Cl. ............................ 365/127; 365/107; 356/345
[58] Field of Search .................. 365/107, 127, 153; 356/345

[56] References Cited

U.S. PATENT DOCUMENTS 3,566,371  2/1971  Barnes ........................... 365/127
3,833,894  9/1974  Aviram et al. .................. 365/127
4,078,229  3/1978  Swanson et al. ................ 365/127

*Primary Examiner*—Terrell W. Fears
*Attorney, Agent, or Firm*—Townsend and Townsend

[57] ABSTRACT

A multiple beam or "multiphoton" absorption effect is used for creating three-dimensioal sensible objects including optical elements and three-dimensional computer-type data storage and retrieval systems. The objects and systems are made according to the invention by at least two beams of optical electromagnetic radiation having a spectral characteristic matched to the excited state properties of active media molecules, wherein the beams are simultaneously or sequentially directed to a common target location to effect a desired photochemical reaction. The first beam effects excitation of the molecule of the active media at the target locations such that the coincidence of the second beam and absorption thereof by the individual molecules at the target location effects a controlled chemical reaction causing a change in physical or refractive index characteristics, or in other words, production of physical or refractive index inhomogeneities.

11 Claims, 24 Drawing Figures

ILLUSTRATION OF A PLANAR INDEX DISTRIBUTION.
ISO-INDEX REGIONS ARE PLANES (DOTTED LINES)
PERPENDICULAR TO THE OPTICAL AXIS.

SIDE VIEW OF A SLAB WITH A SPHERICAL INDEX
DISTRIBUTION, ISO-INDEX REGIONS IN THREE
DIMENSIONS ARE SPHERES CENTERED ON THE
CENTER OF CURVATURE.

ILLUSTRATION OF A CYLINDRICAL INDEX
DISTRIBUTION, ISO-INDEX REGIONS ARE CYLINDERS
(DOTTED LINES) CENTERED ON THE OPTICAL AXIS.

ILLUSTRATION OF A LINEAR PLANAR INDEX DISTRIBUTION, WITH AN INDEX FUNCTION N (X) EQUALS 1.50 PLUS 0.01X.

ILLUSTRATION OF A POLYNOMIAL PLANAR INDEX
DISTRIBUTION WITH AN INDEX FUNCTION
N (X) EQUALS 1.50 PLUS 0.01 PLUS 0.01X$^2$.

ILLUSTRATION OF A SLAB HAVING THREE DISTINCT INDEX REGIONS.

A PRISM WHOSE INDEX OF REFRACTION VARIES ACCORDING TO THE ILLUMINATION FROM TWO DIFFERENT COLOR LAMPS "A" AND "B", WITH A CONSEQUENT DEFLECTION ANGLE FOR A LIGHT BEAM OF A THIRD COLOR.

A SINGLET LENS CORRECTED BY RAISING THE REFRACTIVE INDEX TOWARD THE CENTER.

MARGINAL RAY FOCUS IN UNCORRECTED LENS.

A SINGLET LENS CORRECTED BY LOWERING THE REFRACTIVE INDEX TOWARD THE MARGIN.

THE CLASSICAL INHOMOGENOUS REFRACTIVE INDEX "WOOD LENS". THE ISO-INDEX REGIONS (DOTTED LINES) ARE CYLINDERS CENTERED ON THE OPTICAL AXIS.

COLLIMATED LIGHT SOURCE  DIAPHRAGM  CELL

AN ARRANGEMENT OF APPARATUS FOR GENERATING A RADIAL GRADIENT ELEMENT.

$N(X)$ equals $N_0 + N_1 X$

ILLUSTRATION OF A SINGLET WITH A PLANAR INDEX DISTRIBUTION, ISO-INDEX REGIONS ARE PLANES PERPENDICULAR TO THE OPTICAL AXIS.

ILLUSTRATION OF A GENERALIZED "WOOD LENS". ISO-INDEX REGIONS (DOTTED LINES) ARE CYLINDERS CENTER ON THE OPTICAL AXIS.

ILLUSTRATION OF A SINGLET WITH A RADIAL OR CYLINDRICAL INDEX DISTRIBUTION. ISO-INDEX REGIONS (DOTTED LINES) ARE CYLINDERS CENTERED ON THE OPTICAL AXIS.

A MORE COMPLEX OPTICAL ELEMENT COMPRISING TWO ELEMENTS OF CYLINDRICAL ISO-INDEX SURFACES PERFORMING AS A CEMENTED DOUBLED APLANATIC TELESCOPE OBJECTIVE.

ILLUSTRATING AN F/6.3 SINGLET WITH A CYLINDRICAL INDEX DISTRIBUTION. ISO-INDEX REGIONS ARE CYLINDERS CENTERED ON THE OPTICAL AXIS.

$N(R) = N_0 - N_1 R^2 - N_2 R^4$

AN EXPERIMENT IN THE APPARATUS OF FIGURE 34, BUT NOT ACCORDING TO THE INVENTION, YIELDS THE ABOVE PROFILE OF POLYMERIZATION.

AN EXPERIMENT IN THE APPARATUS OF FIGURE 34 ACCORDING TO THE SINGLE-BEAM/ENERGY TRANSFER AGENT VARIATION OF THE INVENTION. A TRUE RADIAL GRADIENT INHOMOGENOUS LENS IS OBTAINED.

ILLUSTRATING AN AUTOMATED SYSTEM CAPABLE OF
REAL-TIME TESTING AND GENERATION OF INHOMO-
GENOUS OPTICAL ELEMENTS OF THIS INVENTION.

BIT PLACEMENT AND LOCATING MEANS USING IN-SITU GENERATED FIBRE-OPTIC. FOCUSING EFFECT CAN IMAGE EXTERNAL LIGHT AT INTERSECTION POINTS (SEE KEARNEY, ELECTRO-OPTICAL SYSTEMS DESIGN, DEC. 1975, P. 18).

SHOWING TWO-PHOTON ABSORPTION PATTERNS WITH CLASS I GROUP 3 SYSTEM.

CLASS I GROUP 3 SYSTEMS

A. ND-YAG AT 1060 NM. AND TUNED LASER AT INTERVALS SHOWN.

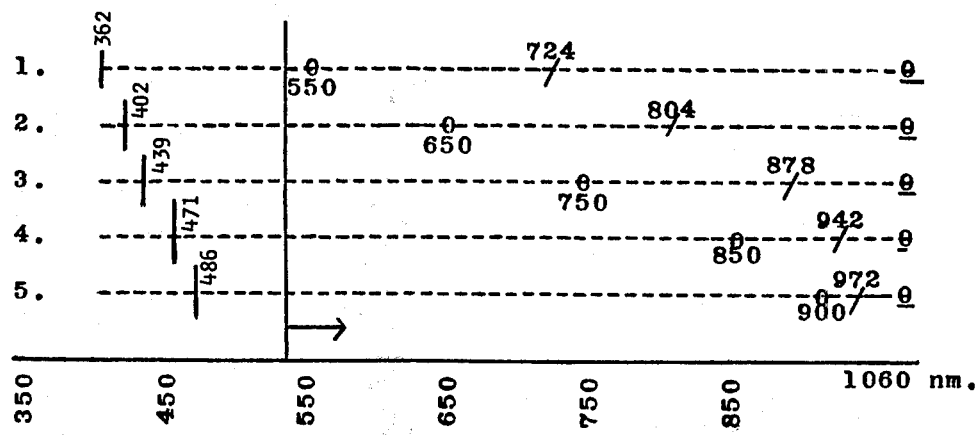

B. RUBY LASER AT 692 NM. AND TUNED LASER AS SHOWN.

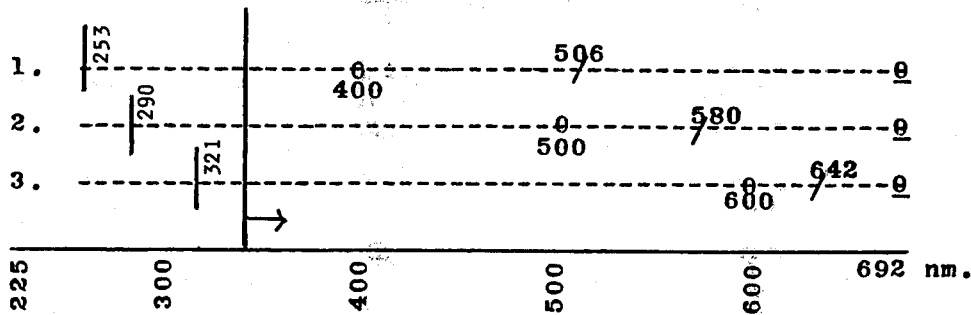

FIG. 21

GRAPH CALCULATED FOR ND-YAG AND SEVERAL TUNED LASER COMBINATIONS (A); FOR RUBY AND VARIOUS TUNED LASER COMBINATIONS (B). (O) SYMBOL SHOWS FORBIDDEN 2-PHOTON ABSORPTION LIMIT AT HIGH INTENSITY LASER EMISSION REGION. (/) SYMBOL SHOWS WAVELENGTH LONGER THAN WHICH SOME TWO-PHOTON ABSORPTION IS REQUIRED WHEN USING TUNED LASER AT (O). AT THE LEFT ARE CORRESPONDING ONE-PHOTON BOUNDARIES WHICH CAN HAVE PREDICTIVE VALUE IN SOME CASES WITH MINIMAL SYMMETRY PROPERTIES.

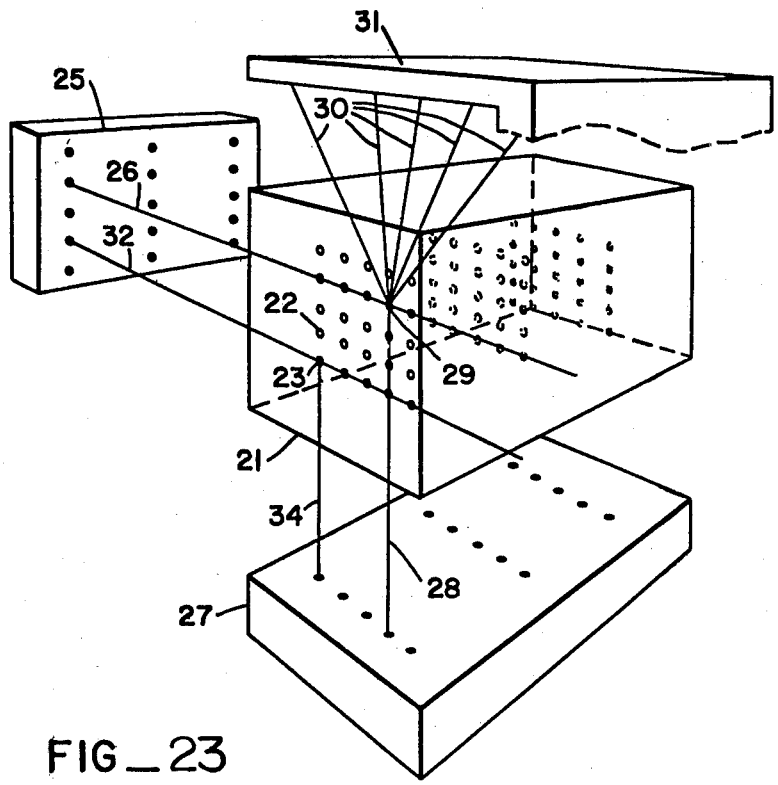
FIG_23
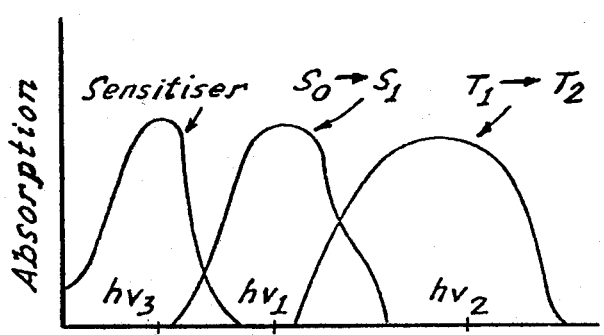
FIG_24

THREE-DIMENSIONAL SYSTEMS

BACKGROUND OF THE INVENTION

This application is a continuation-in-part application of application Ser. No. 856,434 filed Dec. 1, 1977, which is a continuation-in-part application of application Ser. No. 544,480 filed Jan. 27, 1975, now U.S. Pat. No. 4,078,229 issued Mar. 7, 1978. All subject matter of the parent and grandparent applications are expressly incorporated by reference herein.

The invention relates to production of three-dimensional sensible objects and optical inhomogeneities in an active media distributed within a suspension medium by the combined effect of at least two intersecting beams of optical radiation to form a region within a volume of a suspension medium, which region is manipulated to a desired shape and dimension. More specifically, the invention relates to the application of mechanisms of two-stage photoresponsive reactions within a single molecule effected by at least two independently controllable photon sources. By photoresponsive reaction mechanism we means chemical reaction mechanisms stimulated by exposure to optical radiation. By active media we mean the substances which are characterized by said photoresponsive reaction mechanisms. By suspension medium we mean the substantially inert supporting fluid in which an active media is dispersed. The two-stage photoresponsive reaction mechanisms will be explained hereinafter.

DESCRIPTION OF THE PRIOR ART

Prior art U.S. patents have disclosed light emitting generators for display purposes (Nos. 3,123,711; 3,397,316; 3,474,248; 2,604,607; 3,829,838), means for generating residual inhomogeneities in volumes using photosensitive materials which are responsive to energy levels (No. 4,041,476 Swainson) and means for generating three-dimensional patterns using focused heat effects in thermally sensitive material (Nos. 3,829,838; 3,636,250). Useful background material on simultaneous and sequential multiphoton absorption are the following:

R. O. Kan, *Organic Photochemistry*, Ch. 1, McGraw-Hill, 1966.

Applied Optics Vol. 11, No. 2, pp. 354-359 (Feb. 1972).

In the present invention, so-called "multiphoton" processes are further exploited. By "multiphoton" we mean to refer to the coincidence or intersection of at least two beams of electromagnetic radiation at a target location in a molecule with sufficient incident energy to effect a selected change of energy level within the molecule as by photon absorption. The coincidence of at least two beams or photons at a common target location, either simultaneously or sequentially, is used to effect a variety of chemical reactions, depending upon the active media, with applications herein disclosed.

The following discussion is a disclosure of selected active media for forming the systems which have been herein classified to aid in the understanding of the inventive contribution.

The present application extends the teachings of U.S. Pat. No. 4,041,476 of Swainson to disclose additional subclassifications of known systems described therein as "Class I systems" (hereinafter referred to as "Class I Group 1 systems") and as "Class II systems" (hereinafter referred to as "Class II Group 1 systems").

The new subclasses according to this invention are referred to as Class I Group 2, Class I Group 3, Class II Group 2 and Class II Group 3.

Known mechanisms depended on conventional one-photon reactions carried out either simultaneously or sequentially in a matrix (i.e., within a suspension medium containing active media).

The new mechanisms according to the invention of Class I Group 2 exploit the simultaneous multiphoton absorption phenomenon in a single excitable species using radiative excitation states of the same energy.

The new mechanisms according to the invention of Class I Group 3 exploit the simultaneous multiphoton absorption phenomenon in a single excitable species using radiative excitation states of different energies.

The new mechanisms according to the invention of Class II Group 2 exploit the stepwise or sequential multiphoton excitation of a single excitable species using excitation radiation of different energies wherein an intermediate step-condition is confined to the excited state.

The new mechanisms according to the invention of Class II Group 3 exploit stepwise or sequential multiphoton excitation of a single excitable species wherein at least one of the intermediate step-conditions is a ground state.

The excited state materials either directly or by subsequent interaction with components of the active media serve to produce "patterned products", that is, sensible objects or physical objects, optical inhomogeneities useful in specialized lenses, and the like, according to the invention. Moreover, in several remarkable variations of the invention, the active media can exhibit transparency to uncombined exciting radiation states permitting effects not possible with simple Grotthus-Draper-obedient photoreactions, as hereafter explained.

One object of the present invention is to provide means whereby a large group of conventional one-photon photoresponsive materials can be utilized in systems with selected radiation states so as to convert the conventional one-photon single stage photoresponsive behavior to a two-stage (multiphoton) behavior required for construction of three-dimensional patterned products.

Another object of the invention is to provide for creation of inhomogenous optical elements wherein the optical inhomogeneities can be placed accurately with control of symmetry properties, rate of change properties, and boundary properties, or in other words, specialized lenses and the like.

It is another object of the invention to provide improved means for the production of three-dimensional articles through photoresist differentials of solubility and volatility.

Another object of the invention is to provide computer memory storage elements and methods for storing and retrieving digitized data.

Another object is to provide chemical "amplification" and chemical "sensitization" mechanisms so as to increase the range of materials useful in the practice of the systems of the invention. By "amplification" mechanisms, we mean intermediate reaction mechanisms useful for producing an intermediate product which may be further reacted to produce an end product. By "sensitization" mechanisms we mean mechanisms which require chemical reaction with another substance, herein referred to as a "sensitizer", to produce an end product in a "sensitized system".

Further Selected Definitions:

1. "Radiation state" is defined as a specific condition of electromagnetic or particulate radiation as distinguished by a unique and complete set of parameters describing: (a) the wavelength, intensity, polarization, and propagation direction, if the radiation is electromagnetic; and (b) the deBroglie wavelength, particle current density, nature of excitation and/or ionization (if applicable), polarization, and propagation direction, for particulate radiation.

2. "Active region" or "target location" is defined as the patterned distribution locus within a volume of suspension medium containing active media wherein at the conclusion of the sequence of placed photochemical reactions, including simultaneous or sequential two-photon reaction, amplification reactions, and the like, there develops the desired inhomogeneity according to the invention. In the formulae the active region or target location is designated by the symbol "X".

The active region may be characterized by the presence of radicals, ions, colored products, energy transfer agent, and physiochemical alteration.

"X" can also represent additional stages of excitation where more than two-photon mechanisms are used.

3. In the formulae $hv_1$ is a primary beam; $hv_2$ a secondary beam; $^1A$ indicates an atom or molecule in ground state; $^1A_{v/r}$ indicates an excited species in higher vibrational/rotational level of ground state manifold; $^1A^*$ indicates an excited species in excited singlet manifold; $^1A^{**}$ indicates an excited species in higher singlet manifold; $^3A^*$ indicates an excited species in excited triplet manifold, $^3A^{**}$ indicates an excited species in higher excited triplet manifold. The letter v rather than the conventional Greek "nu" is used throughout to indicate optical frquency. h is Planck's constant.

The invention will be better understood by reference to the following detailed description with examples with accompanying formulas and formal drawings. The examples are intended only as illustrative and not as limiting the invention.

BRIEF DESCRIPTION OF THE DRAWINGS

FIG. 21 is a graphical representation of a spectrum for a two-photon system using Ruby and Nd-Yag lasers.

FIG. 23 is a computer memory application of the invention.

FIG. 24 is a graphical representation of a singlet, triplet sensitizer absorption spectrum.

DETAILED DESCRIPTION OF PREFERRED EMBODIMENTS

Figure 1:
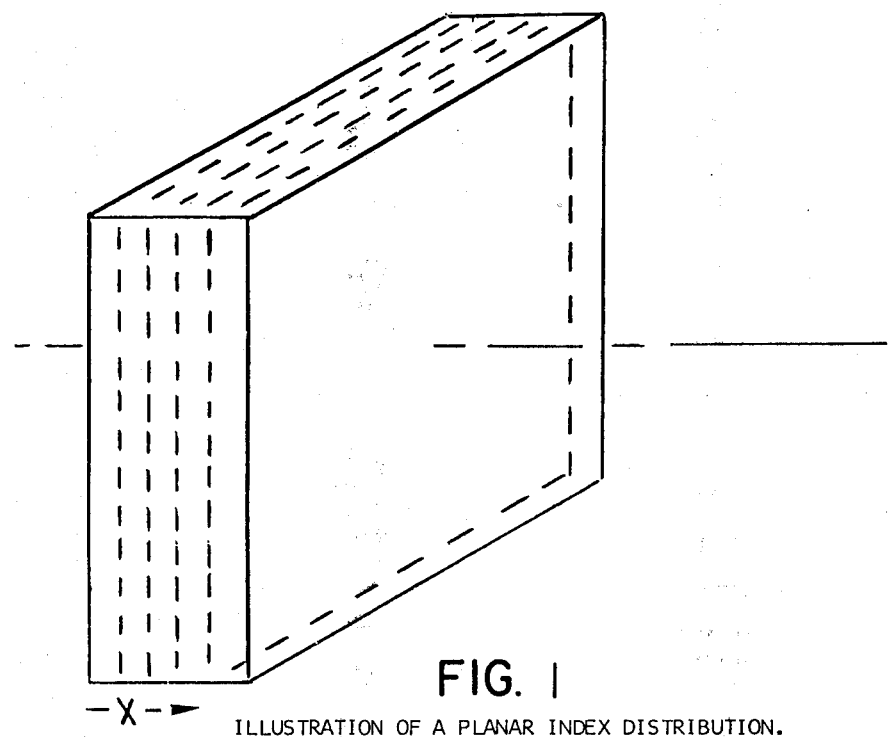
FIG. 1 is an optical element having planar index distribution.

According to the invention an elevation of energy level is induced at target locations within a volume of material (a mixture of active media and a suspension medium) through the coincidence of uniquely defined electromagetic radiation of at least two optical sources, creating a useful intermediate product or end product. The radiation is distinguished by unique parameters of wavelength, intensity, polarization and propagation direction. Specifically there occurs in response to the incident optical radiation at the target locations "useful" levels of simultaneous multiphoton absorption or stepwise multiphoton absorption in targeted molecules which thereupon undergo a photoresponsive chemical reaction producing a useful intermediate product or end product.

The method, media and apparatus according to the invention comprise the following elements in common:

(a) a substantially transparent dispersion fluid capable of maintaining a relatively stable shape containable with a volume;

(b) a photoreactant or active media substantially dispersed in the dispersion fluid, a molecule of said photoreactant being responsive to a first photon of optical radiation emitted in a first selected spectral region to excite an electron to an excited state and also being responsive to a second photon of optical radiation emitted in a second selected spectral region to generate a monomolecular chemical reaction.

The photoresponsive reactant or photoreactant molecule is responsive either to the simultaneous or sequential confluence and absorption of the first and second photon.

The medium may comprise a lens system or an optical computer memory as hereinafter described or it may be a morphically stable persistent three-dimensional object.

The active media may be a liquid, such as a photopolymerizable monomer, a mixture of monomers, a mixture of monomer and polymer, or a viscous polymer capable of further photoresponsive reaction. The active media may also be a solid, such as a gelled polymer, a frozen monomer, a reactive species within a plastic matrix, a glass, or a crystalline material.

The energy sources may be lasers, arc lamps, or other beams of electromagnetic radiation. Preferably the "patterning" or initial stage of inhomogeneity generation is carried out using narrow spectral band light emitters such as lasers or filtered arc lamps in the ultraviolet, visible, or infrared portions of the spectrum. The specific combinations of radiation states are selected according to the requirements of the simultaneous or stepwise multiphoton excitation processes to be exploited. Because of the range of quantitative variation in active media, power requirements for activation vary widely.

Multiphoton absorption is facilitated by the presence of resonant or nearly resonant intermediate states in the system. As the first photon in such a system gets closer and closer and into the line-width of an absorption, the second photon is then resonant from the first excited level to the second level. From the point of view of efficiency and contrast such systems using resonant or nearly resonant intermediate states are to be preferred.

Hereafter is a detailed disclosure of mechanisms, chemical systems and products according to the invention.

SIMULTANEOUS MULTIPHOTON ABSORPTION SYSTEMS

Class I Group 2

The simplest example of the Class I Group 2 systems using simultaneous absorption of two similar photons is diagrammed:

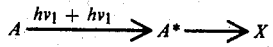  Formula 1

As indicated in Formula 1, two identical photons designated $h\nu_1$ are absorbed by a photoresponsive reactive material in a lower state, usually a ground state. (The reaction can also be part of a more complex series where A is an intermediate excited state.) A is then converted to the excited state $A^*$, from which excited state the material passes to the product state X. This product state can be either an immediately useful end product or it can participate in further reaction, catalysis, amplification, etc.

As a general rule in the practice of the invention we will assume that a specific system will have as a design starting point a given material with known one-photon photoresponsive reactive properties, although it is also possible to work from knowledge of available light sources and to match the photoresponsive reactive material to these directly or by the use of sensitizers with appropriate absorption characteristics. In order for simultaneous two-photon absorption to occur, the wavelength $h\nu_1$ should be selected so that the energy difference between A and $A^*$ is equal to or less than twice the frequency of $h\nu_1$ but greater than $h\nu_1$, i.e., $h\nu_1 < E \leq 2h\nu_1$.    Formula 1A The following are a few examples of the Class I Group 2 systems using photons of the same energy.

(1) A frozen glass of styrene monomer in a pyrex cell is exposed to a first focused, high intensity pulsed ruby laser with peak powder about $3 \times 10^5$ Watt. A second beam is focused to intersect the first beam. The intersecting focus is slowly moved through the center of the target medium leaving a trail of polymerized material.

Other monomers such as p-isopropyl styrene or chlorine substituted styrene derivatives give greater yields of polymer and the addition of a difunctional monomer like divinylbenzene will decrease the solubility of the polymer pattern.

(2) A solution of 8'allyl-6'nitro-1,3,3-trimethylspiro-(2' N-1-benzopyran-2'-2-indoline) in benzene is exposed to intersecting synchronized pulsed ruby laser beams (4 J ouptut free lasing mode, pulse length $3 \times 10^{-4}$ sec.) with a UV elimination filter. At the region of intersection a spot of color is formed which fades in about 10 seconds.

The same experiment may be repeated using the apiropyran dissolved in a plastic (polymothylmethacrylate) in which case the time for fading of the color takes several minutes. This rate of fading can be controlled by altering the temperature. Other photochromics can be used in a similar way.

(3) A transparent matrix incorporating leucoazure A produces a red color if illuminated as above with beams of high intensity pulsed ruby laser light. Other color generating compounds such as photochromics of the 2.4-dinitrophenylpyridine type can be used to generate nonpermanent moving display images. The speed of the color-fading reaction can be controlled with a $10^5$-fold variation by altering the pH of the system.

(4) A viscous solution containing $10^{-2}$ M Eosin Y, $10^{-3}$ p-toluenesulphinic acid, 30% acrylamide, 5% methylenebisacrylamide in ethylene glycol is exposed to a group of high intensity intersecting beams from a ruby laser. Polymer forms at the intersection region as material with a refractive index different from the surrounding material, both of which exhibit transparency.

Class I Group 3

The simplest example of a Class I Group 3 system using the simultaneous absorption of two dissimilar photons is:

  Formula 2

In systems of this type the frequencies and energies of $h\nu_1$ and $h\nu_2$ are preferably different and selected to meet the following conditions:

$E \leq (h\nu_1) + (h\nu_2)$, $(h\nu_1) > (h\nu_2)$, and $E > 2(h\nu_2)$    Formula 2A Under these conditions a very intense but low photon energy beam of $h\nu_2$ is intersected with a less intense but higher photon energy beam of $h\nu_1$. It is convenient to think of this system as similar to the above described Group 2 system, except that Group 2 uses two photons of usually half the energy of the photon energy used to drive the one-photon process of photoreaction with the given active media. In the present Group 3 system, the sum of the dissimilar photons calculated as energy is equivalent to the sum of the two similar photons calculated as energy.

Figure 22:
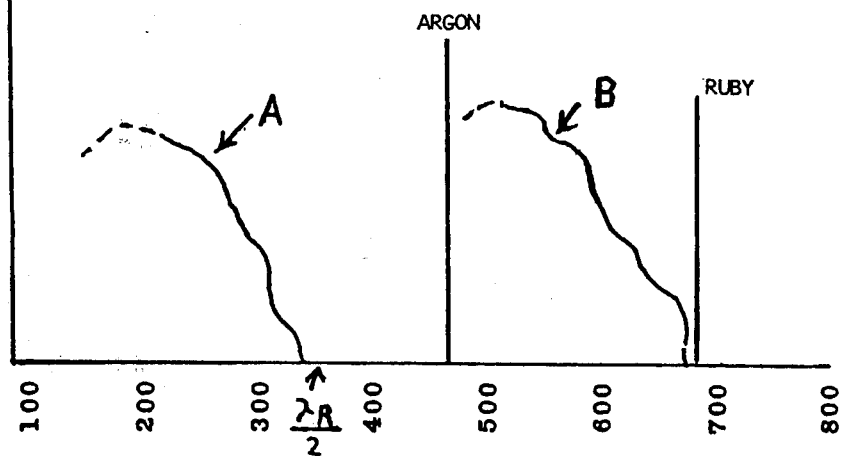
FIG. 22 is a graphical representation of a two-photon absorption pattern.

A system of this type can be seen graphed in FIG. 22 where to the left we see a typical absorption spectrogram of a photoreactant in conventional one-photon process, while on the right an approximately congruent two-photon absorptive spectrogram is drawn. Using the identical two-photon process of Group 2, an intense beam of wavelength within the range of the two-photon absorption spectrogram would be used to drive the reaction. In the preferred Group 3 mode using dissimilar photons, at least the high intensity ($h\nu_2$) beam must be specifically excluded from the two-photon absorption region.

The beam sources have the following complementary relationship:

A. Source 1 has low energy per photon and a high intensity.

B. Source 2 has high energy per photon and a low intensity. The permissible, necessary, and prohibited values for the photoactive absorption spectrum in two-photon mechanism is established by the wavelengths of these two sources. Photoactive absorption cannot extend into the region longer than the wavelength of source 1 (the high intensity source) nor will it be effective in forming an active region if it is shorter than the wavelength $\lambda X$ in:

$$\lambda X = \frac{2(\lambda a)(\lambda b)}{\lambda a + \lambda b} \qquad \text{Formula 2B}$$

Should the selected active media have an absorption which trespasses in the longer region, then two photons from the high energy source will be sufficient to drive the reaction in the whole path track of that source. Should the absorption spectrum be confined to the region shorter than the wavelength $\lambda X$, then the active region of the invention will not be generated because of inadequate energy at the intersection. However, at least a portion of the absorption spectrum must extend into the region between these limits in order for the necessary conditions to be fulfilled.

The general absorption spectrum of a material is not always identical with the photoactive absorption spectrum. For example, where photoactive absorption coincides with the wavelength of a radiation source this would be a forbidden condition resulting in spurious imaging by one-photon conventional reaction all along the radiation path. On the other hand, where this absorption was not photoactive absorption, then there would be attenuation and loss of efficiency through wasted absorption and heating.

In general, systems with resonant transition are preferred where high yields of product are desired. The probability of a two-photon transition is inversely proportional to how far from resonance (e.g., from a one-photon transition) the intermediate state is compared to the photon energies. Ideally the gap is diminished close to the limit of the "correspondence" (at "correspondence" it is meant a sequential process), just in the toe of the line, so as to reduce the energy denominators in the two-photon absorption cross-section as far as possible.

The particular value of systems with resonance or near resonance lies in the efficiency and high yield which they make possible. In the expression $$\left( \frac{<o|\mu|\iota> <\iota|\mu|2>}{\epsilon_\iota - h\nu_1} \right)^2 \qquad \text{Formula 2C}$$

$<o|\mu|\iota>$ is proportional to the one-photon absorption coefficient to an intermediate level, $<\iota|\mu|2>$ represents a second one-photon transition from the intermediate level to the final level. $\epsilon_\iota - h\nu_1$ represents the difference or gap in energy level between photo $h\nu_1$ and the intermediate energy level. The probability of this two-photon transition can be seen to be proportional to the product of the two absorption coefficients $<o|\mu|\iota>$ and $<\iota|\mu|2>$ divided by the energy gap between the intermediate level and the energy of photon $h\nu_1$. When the gap where the photon energies break is small, then the energy denominator is small and the probability (and yield) is very large. (Should the gap be reduced to zero, then we no longer have a simultaneous Class I system, but a sequential Class II system.) Thus to get a strong transition and high yield it is necessary to use an intermediate state or states where a one-photon transition is strongly allowed and has a high energy and there is an intermediate energy level slightly higher than the energy of $h\nu_1$.

Of particular importance when yield is under consideration is the selection of materials with appropriate excited state lifetimes for the particular purpose. For example, a long-lived excited state may result in energy transfer to nearby molecules so often as to degrade resolution, thereby creating a trade-off condition between yield and resolution requirements.

An alternative mechanism for the direct excitation of a ground state molecule to triplet excitation has been described by C. T. Lin (Spectroscopy Letters, 8(9), 1975, pp. 901-913):

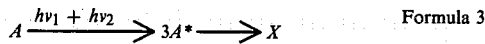

$$A \xrightarrow{h\nu_1 + h\nu_2} 3A^* \longrightarrow X \qquad \text{Formula 3}$$

This mechanism is held to be superior in efficiency to the excitation to singlet state because of the longer lifetime of the triplet state over the singlet, and because energy is not lost through resonant energy transfer.

We will now set forth some general principles to allow selection of suitable radiations and radiation sources for the practical working of the invention using only the known properties of the active media to enable the prediction of two-photon transitions and approximate strength thereof.

When an absorption peak for a two-photon transition is not placed at a position corresponding to twice the wavelength of the one-photon absorption peak, it will be placed at a somewhat high energy position.

The lowest energy transition will be one-photon allowed and may be two-photon allowed but it will not be two-photon allowed and one-photon forbidden.

The materials in which prediction from the one-photon spectrogram implies noncongruence with the two-photon spectrogram are those with strong molecular symmetry:

The following procedure is descriptive of the process followed when given a photoresponsive reactive material with known or estimated two-photon reaction spectrum and laser selection.

Assuming the active media is a single species, such as a monomer susceptible to polymerization, and suitable precautions have been taken to avoid non-selective thermal dissociation, select a first laser source emitting in the mode of the Class I Group 3 system. The high power commercial ruby laser emitting at 694 nm is convenient. Using the known or estimated two-photon absorption which produces photopolymerization of the monomer, turn to Table 10, calculated for the case of use of a ruby laser. Column 1 of Table 10 shows a range of photoactive absorption wavelengths from UV to visible which will be matched to the two-photon absorption characteristic of the selected medium. Using the formula $$E_0 \text{ photon trans.} = 2\left(\frac{2.86 \times 10^4}{\lambda(nm)}\right), \quad \text{Formula 3A}$$

compute the energy in kcal per mole required for the induction of photoreaction in relation to specific laser wavelengths. In the case of ruby emission at 694 nm=λ, the derived energy requirement for a specific absorption region is given in column 2 of Table 10.

Depending on optical density and the medium size, a selected wavelength for activation may be placed at the peak absorption region, or with large volumes, on the slope or near the foot of the absorption region. In most cases it is best to use energy sources focused at the region of interest. Having established the laser wavelength of one beam at 694 nm and an absorption region at, for example 380 nm, using the formula $$b = \frac{a(57,200)}{Ea - 57,200} \quad \text{Formula 3B}$$

establish the frequency constraint on the second laser, given in the third column of Table 10, in this case for b=846 nm, or shorter.

Examples of Class I Group 3 two-photon absorption systems utilizing different frequencies are as follows:

(5) A cell filled with diphenylcyclopentadiene solution is illuminated with intersecting beams corresponding to wavelengths 9431 cm$^{-1}$ and 18862 cm$^{-1}$ (hv$_1$ and hv$_2$). (If desired, a single laser can be used to form the first path through the medium and unabsorbed emission from the fat side can be passed through a KPD second harmonic generator crystal (to form hv$_2$) and a filler (to remove hv$_1$), and then be reflected back on an optical path which will cause it to reenter the medium from a new point to intersect with the original path.) Fluorescence occurs as expected according to known art. In order to use the active media according to the invention, add to the media an additional component capable of reacting to the internal fluorescence emission so as to generate a secondary region and non-radiation emissive product of the invention.

(6) Dissolve chromium carbonyl with methylmethacrylate and azoisobutyronitrile and heat at 50° C. until all polymerization is complete. Penetration of this active media by intersecting beams as above results in two-photon absorption producing an intense yellow color which is stable at 77° K., but which fades in several hours at room temperature.

(7) Barium acrylate is dissolved in a hot solution of gelatin containing methylene blue, p-toluenesulphinic acid and cooled until a gel is formed. Two-photon absorption as above by the methylene blue generates radicals at the beam intersection which polymerizes the barium acrylate, yielding an opaque, light scattering polymer image.

(8) A frozen glass of acrylonitrile in which is dissolved a substantial percentage amount of a light activated radical generating compound like benzoin or azoisobutyronitrile is exposed as above. Two-photon absorption by the catalyst generates radicals which form light scattering insoluble polymer.

(9) A solution of photo crosslinking agent such as 2-methyl-anthraquinone or 1-chloroanthraquinone in a suitable monomer such as vinyl acetate, styrene, methyl acrylate, etc., containing a photopolymerization catalyst whose absorption spectrum is similar to the cross linking agent is frozen, the frozen solution is then two intense beams of light. At the intersection point the monomer is polymerized and crosslinked. After exposure the glass is melted and the exposed areas separated from matrix with or without the use of solvents.

(Examples 10–15 omitted).

STEP-WISE MULTIPHOTON ABSORPTION SYSTEMS

Class II Group 2

The present Class II Groups 2 and 3 systems have been developed from mechanisms of step-wise two-photon excitation recently developed as analytical and chemical process techniques. The Class II Group 2 systems differ from the Class II Group 3 systems in that the former have only excited state intermediates, usually singlet or triplet states, whereas the latter have at least one ground state intermediate.

The higher excited state or its precursors may be a higher vibrational, rotational and/or electronic state. The transition from precursor to the desired excited state must take place before vibrational or electronic relaxation or transfer of excitation energy to surrounding molecules can occur. In some cases this will require the use of high intensity or pulsed laser sources.

There are three fundamental types of reaction falling under the classification of Class II Group 2 sequential two-photon excited state intermediate reactions.

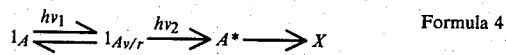

Formula 4

In the above mechanism the energy requirement to reach the state $1_{Av/r}$ is relatively low, and as a result it is practical to use a wavelength in the lower or infrared energy region for hv$_1$. Examples of such reactions are found in the article by V. S. Letoknow (Science, vol. 180, 1973, pp. 451–458).

The second type of sequential two-photon excited state intermediate reaction type is diagrammed thus:

Formula 5

The following is an example.

(16) An azulene solution is illuminated with a primary beam of wavelength 530 nm and a secondary beam of wavelength 1060 nm. The primary beam raises the azulene molecules along its path to an excited vibrational level of the lowest singlet S$_1$. (If not further stimulated these molecules return to the ground state without fluorescing.) At the intersection region, where the two beams act sequentially, the molecules in the S$_1$ excited state are raised to the S$_2$ state by the secondary beam, and then fluorescence emission occurs.

Although theoretical understanding of the following mechanism is slight, a third sequential two-photon excited state reaction is:

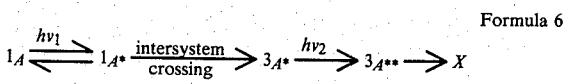

Formula 6

In this case a molecule capable of absorbing energy of appropriate wavelength forms an excited singlet which then undergoes intersystem crossing to form the triplet state. These triplets are incapable of forming radicals or undergoing figure-producing reactions and soon decay into the ground state if they are not further stimulated. However, if the triplets are exposed to radiation of appropriate frequency they are capable of forming excited triplets which are highly reactive and capable of the various desired reactions. In using this system the primary beam generates triplets along its path and the secondary beam raises the triplets to excited triplets at the intersection.

The great advantage of systems having at least two different laser wavelengths in combination over systems relying on single wavelength action of intense photon flux lies in the much lower power requirements and the flexibility of wavelength in the high power laser which becomes possible when it is used in combination with a lower power tunable source. The power requirement can be 1/1,000th of that required in the single wavelength case and because in the two-wavelength case the radiation power in the selecting step is small and does not significantly broaden the vibrational/rotational lines of molecular absorption it becomes much easier to activate specific components of the medium.

The greatest efficiency of energy utilization is obtained by using sequentially pulsed radiations so that $h\nu_1$ is followed by $h\nu_2$ and the time from the beginning of the $h\nu_1$ pulse to the end of the $h\nu_2$ pulse is much shorter than the lifetime of the first intermediate excited state. Suitable sources for beam radiation can be divided into two general groups:

The first group is made up of lasers of moderate powers and variable wavelength in the infrared for selective excitation of vibrations of molecules, and in the visible for electronic level excitation of atoms and molecules. Such lasers include the spinflip class which in general will cover the range between 5 μm and 15 μm; or gaseous high-pressure lasers where the rotational lines overlap and form very wide amplification bands covering the 2.5 μm to 12 μm range with high power level; or Raman lasers with Nd-glass pumping that permits coverage of the 1.2 μm to 2.5 μm range; or organic dye lasers with frequency control covering the range from 0.4 μm to 1.2 μm. Other sources with appropriate output quality control could of course also be used.

The second type of suitable laser has high power output in the ultraviolet and need not provide wavelength tuning but will provide power density ($E_2$) such that:

$$E_2 = h\nu_2/\sigma phd \text{ or } h\nu_2/\sigma phi \quad \text{Formula 5A}$$

where $\sigma$ phd and $\sigma$ phi are photodissociation and photoionization cross-sections. Ruby lasers (with second harmonic 3.6 eV) and Nd-glass lasers (third and fourth harmonics 3.5 eV and 4.7 eV) and the nitrogen laser at wavelength 3371 nm (3.7 eV) are suitable, as are the hydrogen laser (160 nm to 110 nm) or the Xe laser at about 170 nm. From the perspective of energy economy and efficiency recently developed rare gas halide lasers operating in the range of 250 nm to 350 nm are particularly attractive. These last lasers, for example complexed Xe and Chlorine lasers, have high efficiency (i.e., the yield of photons per unit of electrical power can be several orders of magnitude better than obtained with the argon ion laser). Such high photon energy sources are of particular value where free-radicals are desired in the active region since they permit them to be obtained from smaller molecules.

A variety of characteristics are exhibited by the patterned products of the following examples.

(17) Tetramethylphenylenediamine in a EPA matrix at 77° K. forms a blue colored pattern when moved relative to the intersection of beams at 340 nm and 400 nm. The color is due to formation of TMPD radical cation which can also be used to catalyze polymerization. Color forms also in methanol or propylene carbonate solutions and similar systems can be prepared using triphenylene, 3,4-benzopyrene, or diphenyl in boric acid glass.

(18) Beta-naphthol exposed in a polymethylmethacrylate matrix to two beams matched to the singlet band and to the triplet band of absorption will form a semi-stable yellow radical at the beam path intersection.

(19) Naphthalene dissolved in a solution of monomer, difunctional monomer (to effect crosslinking), and ethyl iodide is exposed to two beams of light, 313 nm and to a beam of visible light of wavelength absorbed by the triplet of maphthalene. The resulting excited triplet generates radicals which directly or indirectly polymerize and crosslink the monomer. Other compounds which can be used in place of maphthalene to generate similar radicals are acridan, 9-phenylacridan, toluene, naphthol, acriflavine, and acridine.

(20) Orotic acid and similar compounds also form excited triplets via the biphotonic process. This triplet can abstract hydrogen atoms from suitable donors forming a radical which is a potent polymerization and possible crosslinking catalyst.

(21) Benzoyl and oxalyl chloride and denzophenone dissolved in a polymer form an excited state which renders the polymer crosslinked and insoluble via a similar biphotonic mechanism.

Class II Group 3

In Group 3 systems, the secondary beam absorber is in the ground state, and an intermediate in the excited state may be either a singlet or a triplet.

Group 3 ground state intermediate systems can be prepared in which one or both of the reactions is irreversible. For example:

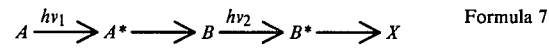

Formula 7

(22) One such system is prepared using a polymethine cyanine dye which under ($h\nu_1$) produces a mono cis isomer sensitive to ($h\nu_2$), giving a colored di cis isomer. Alternatively, rose bengal is incorporated and converted to a de-iodinated derivative by ($h\nu_1$), which in turn is converted to fluorescein by action of ($h\nu_2$), providing a colored fluorescent compound and polymerization catalyst.

A reversible sequential two-photon reaction using the ground state intermediate is depicted as:

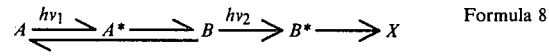

Formula 8

In this case absorption of the ($h\nu_1$) photon by component (A) causes the transformation to component (B). Absorption of the secondary photon ($h\nu_2$) by B will generate a radical, a colored compound, or an energy transfer agent, etc., as described earlier. In those regions not affected by ($h\nu_2$), compound B will decay back to A. This decay can be accomplished by absorption of light or heat energy, and it can be accelerated by suitable irradiation if the desired reversal rate and population yield are not obtained with simple ambient heat and light. Examples of such systems are the following:

(23) O-methyl and o-benzophenones which reversibly photoenolize upon absorption of ultraviolet light active media are irradiated with a blue ($h\nu_2$) and react to form semi-stable cyclic compounds with yellow color.

(24) 2-benzhydryl-3-benzoylchromone and its analogues are irradiated as above. Dihydrobenzofurans are irradiated as above by exploiting photochemical ring opening in combination with photocyclization.

Related furyl-chromones will also undergo photochemical rearrangement between non-fluorescent and fluorescent isomers, making them useful for special purposes described in the following example.

(25) Isoxazoles which convert to azirenes with $h\nu_1$ previously converted to isoxazoles by $h\nu_2$, are irradiated with $h\nu_3$ to yield oxazole from the intermediate azirine.

These and similar materials are especially interesting for the present invention because only one of the forms (oxazole) fluoresces. Thus the patterned dispersal of oxazole can be used as an amplification intermediate, or particularly as the active component in a computer memory described hereinbelow wherein the bit information is in the form of an array of spots in the three-dimensional volume with fluorescence or stimulated emission capability.

(26) C-nitroso compounds are dissolved in aqueous and organic solvents to form stable dimers. The dimers are dissociated to monomers using either heat or ultraviolet light as depicted below.

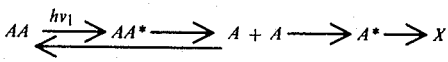

Formula 9

In this system the lifetime of the monomer is dependent on the particular nitroso compound and the choice of solvent and temperature. The monomer as opposed to the dimer has an absorption band in the visible red. Light absorbed by this band photolyzes the monomer, producing radicals. Certain dinitroso compounds such as 1,4-dichloro-1,4-dinitroso-cyclohexane can be used in a similar way. Colored compounds can be obtained if the radicals are trapped by color-forming compounds added to the active media.

Another variation utilizes photochromic materials which are conventionally switched only between two states as shown:

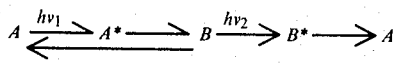

Formula 10

A colored image can be obtained using the appropriate combination of radiations to produce two-photon transition and coloration in the selected regions. This mechanism is a much more flexible and useful technique for complex patterns and can be shown thus:

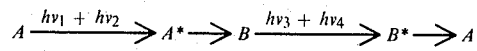

Formula 11

(27) Suitable active media include 6,6'-diethoxythioindigo dyes and derivatives. These media can be optically switched between the cis and trans states using two wavelengths $h\nu_1$ and $h\nu_2$. The two isomers have different colors and properties, including the fact that only the trans isomer fluoresces. An advantage of these materials is a greatly increased quantum yield at high temperatures (90° in some epoxy resins) which provides for stability at lower temperatures after forming an image at a higher temperature.

(28) Also suitable are the oroxides described in U.S. Pat. No. 3,329,502. These compounds are thermally stable and can be switched between colorless or light yellow to red states.

(29) Similarly N,N'-diacetylindigo dissolved in xylene and molten polyvinyl acetate after cooling gives a very stiff polymer solution which on exposure to blue (458 nm) turns to the magenta-colored trans configuration. The diacetyl indigo dye derivatives fluoresce only in the trans form so they can be used in light emitting as well as variable transmissive memory constructions.

Additional details on the stimulated emission property of polymethine dyes (Example 22) together with the description of the use of optical inhomogeneity pattern in lasing structures which by this invention can be three-dimensional are given by Melishchuk (Spectroscopy Lett. 8(9), 1975, p. 669).

For information on the properties in the oxazoles (Example 25) see Abukumov et al. Spectroscopy Letters, 8(9), 1975, pp. 651–667; Andreeshchev, Baroni, Kovyrzina, Rozman and Shoniia in Akademy Nauk, pp. 64–66; and Adrova, Koton, Panov and Florinskii in Adademy Nauk, pp. 39–41.

SENSITIZED SYSTEMS

According to one embodiment of the invention, additional substances are added to the active media which are capable of sensitizing the active media for various purposes as hereinafter described. Such sensitizers are preferably capable of responding to electromagnetic radiation to which another substance of the media is not sensitive and of transferring sufficient absorbed energy to a "receptor" (a substance in the media) in the process of forming the patterned product. The absorption spectrum of a sensitizer is illustrated in FIG. 24. The advantages of this process are many.

For example, the use of sensitizers can reduce the formation of spurious excited triplets in the primary beam path, which can occur where there is overlap between the ground state singlet and triplet-triplet absorption bands. A more common overlap is of the $T_1 \rightarrow T_4$ type. Furthermore, sensitizers can reduce primary beam attenuation since they can be ued in low concentrations. Still further, sensitizers may be used to increase the yield of triplets.

A few examples of sensitizing reactions in systems of both Class I and Class II are given below for illustration.

The following formulas illustrate sensitization mechanisms of Class I.

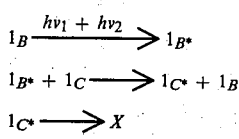

Formula 12

Formula 12 shows absorption of two dissimilar photons by a sensitizer utilizing the singlet-singlet interaction, or fluorescence.

The following Formulas 13 and 14 show singlet and triplet sensitized reactions.

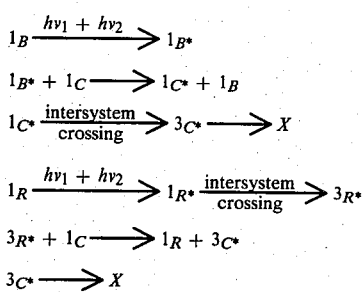

Formula 13

Formula 14

The following formulas and examples illustrate sensitization mechanisms of Class II. In Formulas 15 and 16 the sensitizer absorbs the primary beam, and the energy is transferred to a ground state molecule:

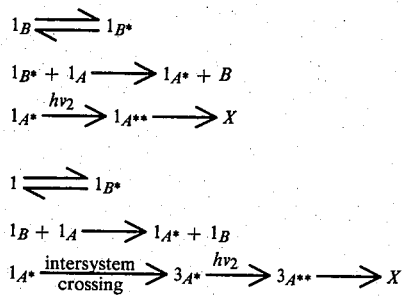

Formula 15

Formula 16

In both of the above systems, sensitization is by singlet-singlet interaction or absorption or fluorescence emission. For the present purposes, it is only necessary that the emission spectrum of the donor and the absorption spectrum of the acceptor overlap. The light used need only be of the wavelength absorbed by the sensitizer; the acceptor can be entirely transparent.

Formula 17 illustrates triplet-triplet sensitization, where, as above, energy is transferred to a ground state molecule.

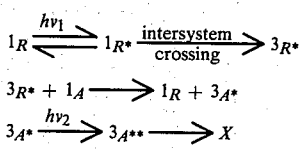

Formula 17

(30) An example according to the pattern of Formula 17 can be prepared by adding benzophenene sensitizer to the system described in Example 19, changing the wavelength of the primary beam to 365 nm, a wavelength which is not absorbed by the naphthalene alone.

In Formulas 18 and 19, the secondary beam is absorbed by the sensitizer and energy transferred to the product of the primary beam. In Formula 18 the sensitizer transfers its energy to the excited singlet, while in Formula 19 the energy is transferred to an excited triplet.

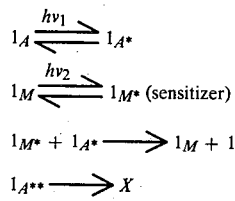

Formula 18

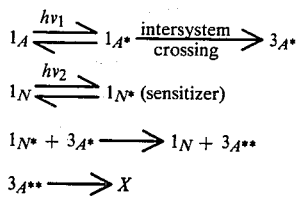

Formula 19

PHOTOCATALYSTS AND "ENERGY TRANSFER" AGENTS

According to another embodiment of the invention, the patterned product "X" is used as an intermediate step for the production of a final product. In one version of this variation, product X will be an agent capable of receiving energy in the form of blanket electromagnetic or particulate radiation. In a simple case, the product X is a distribution of molecules with fluorescence capability which will generally not fluoresce with any of the radiations used to generate the pattern, but which will fluoresce under selected radiation and "transfer" energy thereby to another previously inert photoresponsive mechanism, such as a polymerization process. The advantage of this is that a single fluorescent molecule transfers thousands of photons per second to an acceptor system. Thus the original pattern generating process of either Class I or Class II is subjected to great amplification, permitting a low X concentration while at the same time giving a substantial body of product. This is particularly advantageous in the case where X is obtained through two-photon absorption processes.

The above process can be diagrammed as follows, where L is used to designate a receptor system.

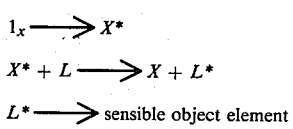

Formula 20

Depending on the resolution requirements, a second component capable of receiving "transferred" energy such as described in the previous paragraph will in general have higher absorption coefficient or higher reactivity to the energy transfer mechanism and also higher concentration in the support medium as the resolution requirement becomes more stringent. It is well within the known art to work out for specific materials tables of concentration in terms of the minimum value of the molar absorption coefficient calculated in terms of desired resolution. These same considerations apply to the various energy transfer mechanisms such as fluorescence emission/absorption; the Förster mechanism of energy transfer; other forms of energy transfer which do not depend on 1/rg, functioning primarily by molecular contact and known in the art generally as various forms of intramolecular radiationless transition.

Examples of sensitizing and amplification systems according to this aspect of the invention are the following:

(31) A dye precursor in a clear matrix is exposed to two intersecting beams of light of appropriate energy such that the two-photon absorption process produces a pattern of distributed dye. The dye (see below) is selected for the ability to photosensitize (T-T energy transfer) the decomposition of the dye precursor via one-photon reaction resulting from absorption of the long wavelength scanning beams or of a separate developing beam. This is shown in Formula 21:

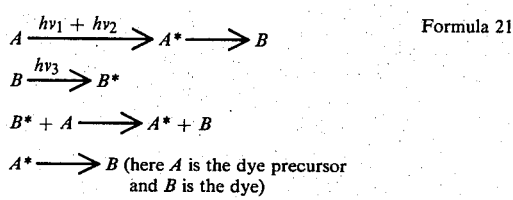

Formula 21

One such system can be prepared in a transparent matrix containing amines such as diphenylamine or N-vinylcarbazole together with an organic halide such as iodoform or carbon tetrabormide. The halide and amine combine to form a complex which on exposure to focused ruby laser forms a small amount of dye which can be increased with red light irradiation.

(32) Stable fluorescers as above can be generated via simulataneous two-photon absorption systems using the fluorescer precursors described by Zweig (J. Pure and Applied Chem., v. 33, pp. 389–440). Useful reactions include oxidative cyclization, dedimerization, tautomerization, rearrangement, elimination, exidation, addition, substitution and reduction. (The preferred materials are discussed at greater length in the section of fluorescence emission memory at the end of this specification.)

The product X may be a photocatalyst instead of an intermediate step. A photocatalyst is distinguished from an "energy transfer agent" by the fact that the photocatalyst does not participate in the subsequent product formation reactions. Examples and formulae follow:

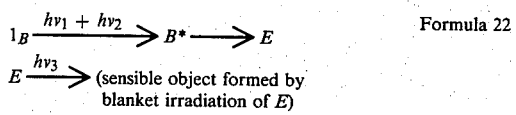

Formula 22

(33) A compound (A) which can generate a polymerization catalyst (B) via a photoreaction is dissolved in a suitable monomer or crosslinkable polymer. Two-photon absorption using intersecting beams is used to generate the active photocatalyst (B) in the desired configuration. The matrix is then exposed to some form of radiation which activates the catalyst (B), but not (A).

(34) The above operation can also be performed using certain dyes capable of initiating polymerization only when they are bound to macromolecular substrates. A gel containing crystal violet leuconitrile, monomer, difunctional monomer, a mild reducing agent, and polymethylacrylic acid is exposed as in Example 4. The dye cation generated by two-photon absorption binds to the polymer. The gel is then blanket exposed to radiation in the absorption band of the dye, which becomes reduced, generating radicals to polymerize the monomer. In this way the inefficiency of the two-photon absorption process is overcome using the light "development" of the weak image.

INHOMOGENOUS OPTICAL COMPONENTS

The above-described examples include several in which the product comprises an inhomogeneity of refractive index. Products of some of the previous examples include materials in which changes in optical properties can be effected, that is, the materials produce products having optical inhomogeneities when operated on according to the invention. These include, Example 4; Example 7 with sodium acrylate or acrylamide is substituted for the barium compound; Examples 9, 10, 11 and 12; Example 17; and Examples 19, 20 and 21.

Materials suitable for production of optical elements of various kinds according to the invention may be broadly described as photochemically active materials capable of being transformed from a condition of one refractive index to at least one other condition of a different refractive index by the mechanisms taught in this specification. In order to utilized inhomogeneities of refractive index for optical purposes it is necessary to control the placement and conformation of the regions according to certain rules. In certain cases such as in the production of apodizing screens, distributions of light obstructing character are of value.

According to this aspect of the invention, specific useful optical products can be constructed using two sources of optical radiation intersecting as previously described where the optical products exhibit gradients of refractive index or "refractive index inhomogeneities".

The refractive index inhomogeneities obtainable according to this invention may be classed under three properties, namely: 1. Symmetry properties, 2. Rate of change properties, and 3. Boundary properties. Each of these properties can be further subdivided.

The following Figures illustrate applications of refractive index modifications according to the invention.

FIG. 1 depicts an optical product illustrating planar gradient symmetry properties. Such an axial gradient exists where the gradient is always parallel to the optical axis. The surfaces of constant index are a plane normal to the axis. In FIG. 1, the dotted lines represent planes of constant index within a plano-plano element and the index function has the following polynomial form:

$$N(X) = N_0 + N_1 X + N_2 X^2 + N_3 X^3 \ldots$$

where $N_0, N_1, N_2 \ldots$ are constants and X is the distance from the face.

Figure 2:
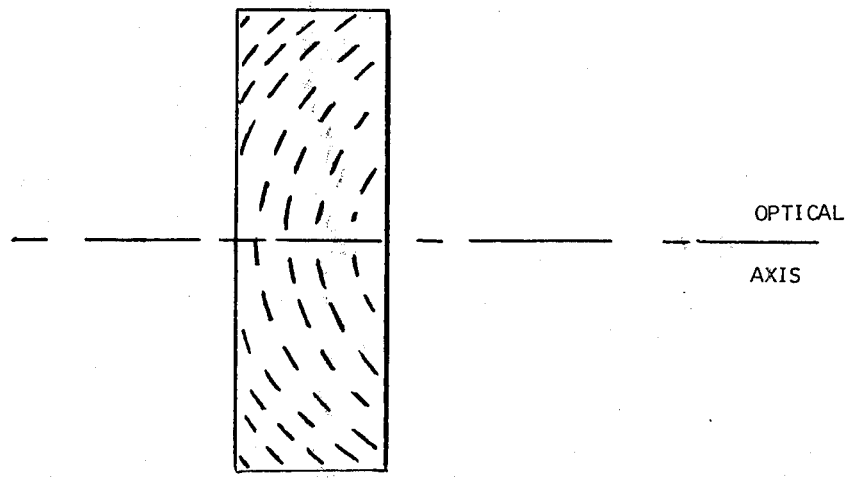
FIG. 2 is an optical element having spherical index distribution.

FIG. 2 depicts an optical product illustrating spherical gradient symmetry properties. The refractive indx here is a function of the perpendicular distance from the surface or a function of the radical distance from the center of curvature. The constant index surfaces are spheres. The form of the index function in this case is:

$$N(r) = N_0 + N_1 r^2 + N_2 r^4 + N_3 r^6 \ldots,$$

where
$N_0, N_1, N_2 \ldots$
are constants, r is the radial distance from the center of curvature.

Figure 3:
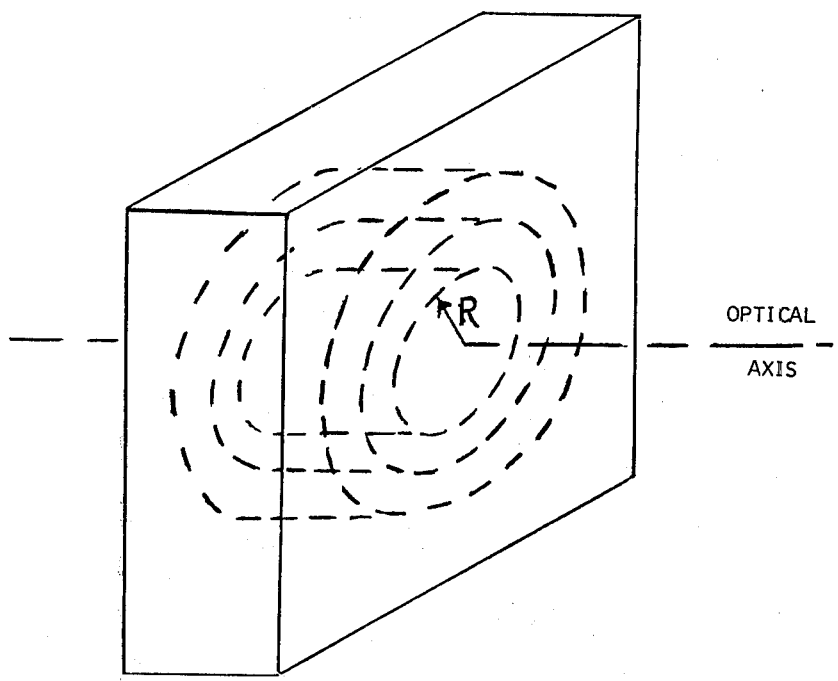
FIG. 3 is an optical element having cylindrical index distribution.

FIG. 3 depicts an optical product illustrating cylindrical gradient symmetry properties. Cylindrical distributions result in a continuous change of index in the direction perpendicular to the optical axis. The surfaces of constant index are accordingly cylinders whose common central axis coincide with the optic axis. Since the gradient of the index is normal to the optic axis, the term "radial gradient" is also used to describe a cylindrical index distribution. The form of the index function is:

$$N(R) = N_0 + N_1 R^2 + N_2 R^4 + N_3 R^6 \ldots$$

where $N_0$, $N_1$, $N_2$, are constants, and R is the perpendicular distance from the optic axis.

It is apparent that many other symmetries can also be prepared in that group with symmetry properties.

Figure 4:
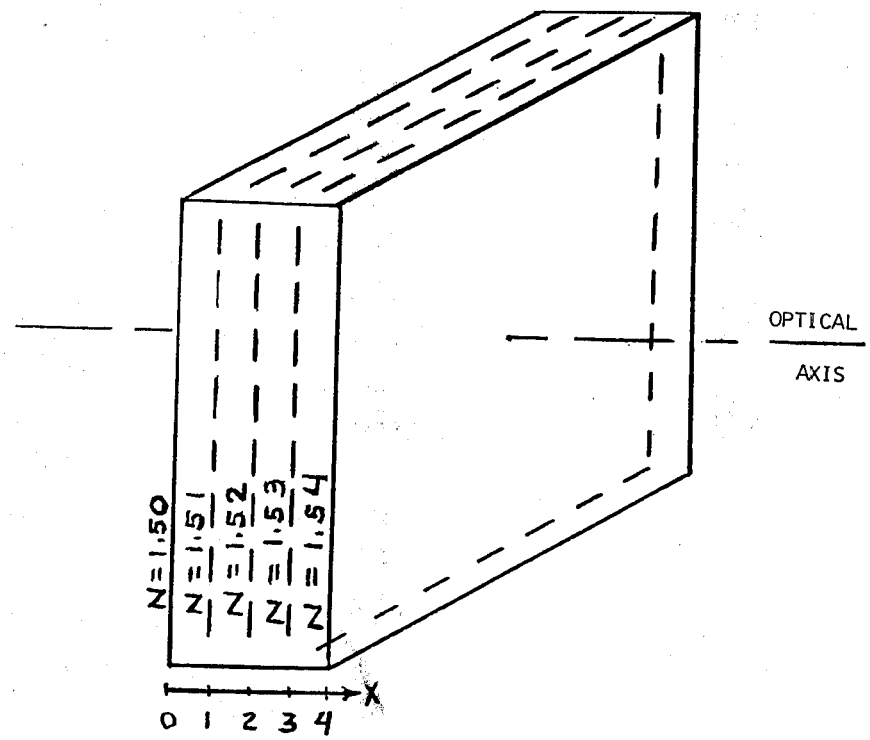
FIGS. 4 and 5 are optical elements having polynomial planar index distribution.
Figure 5:
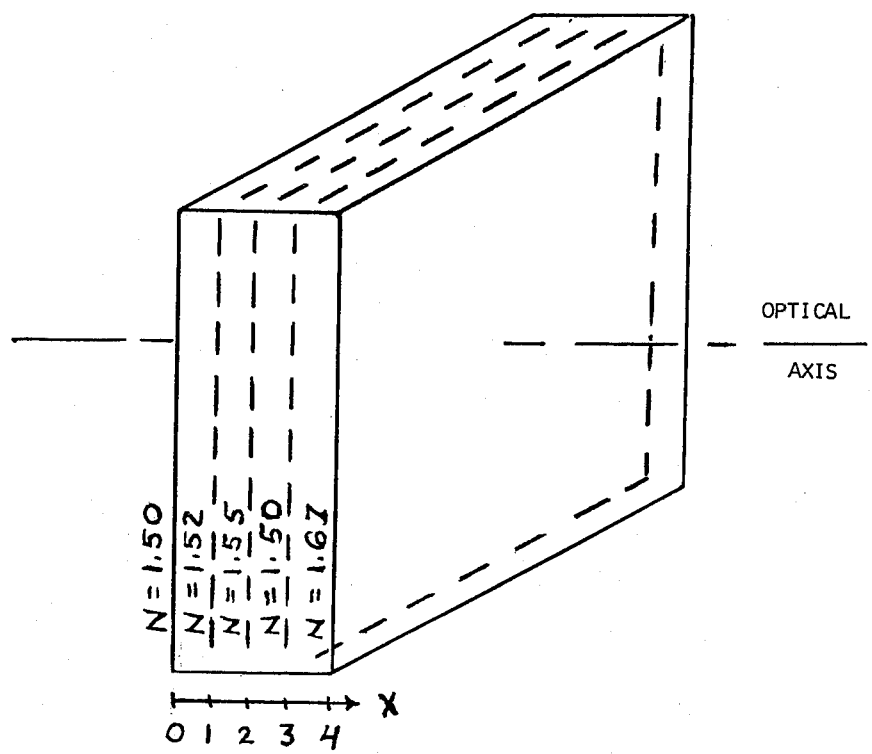
Figure 6:
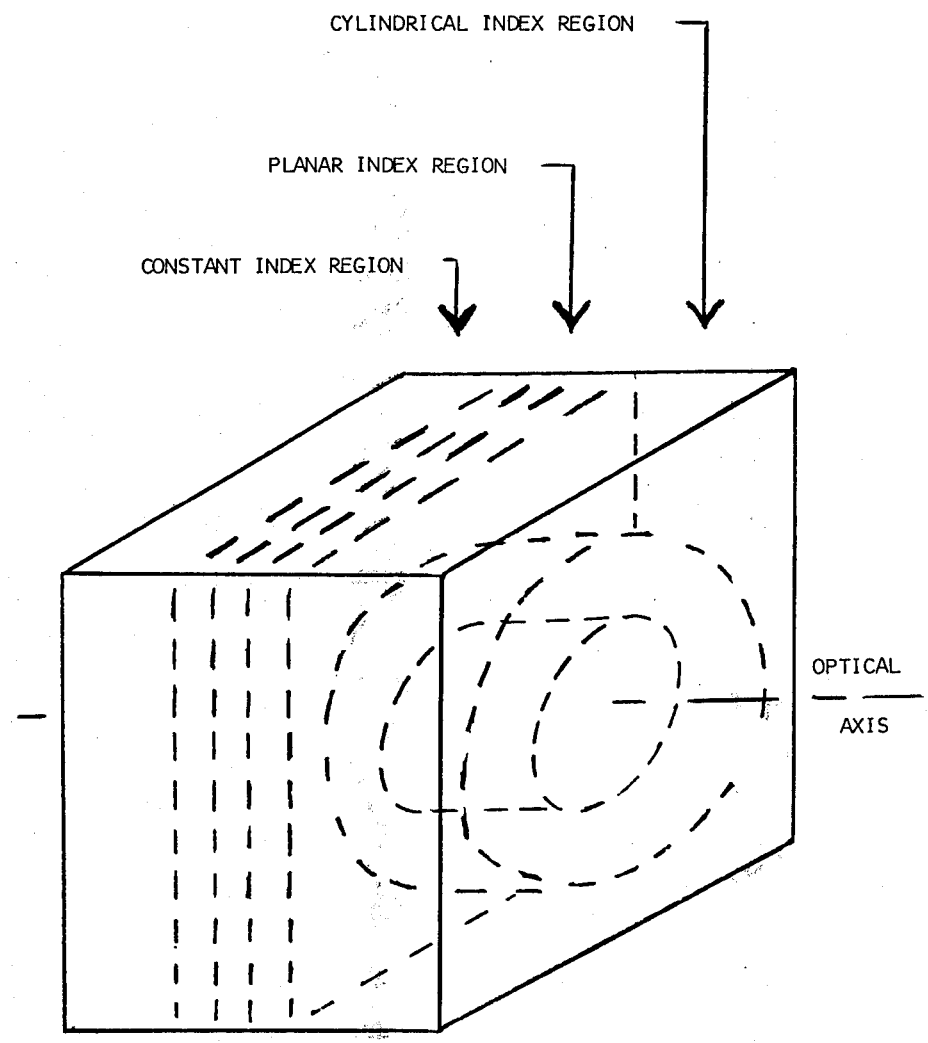
FIG. 6 is an optical element with bounded index distribution regions.

FIG. 4 shows an optical product according to the invention having a linear axial gradient where $N = 1.5 + 0.01X$, while FIG. 5 shows an optical product having a polynomial axial gradient where $N = 1.5 + 0.0X^2$. The description is:

a. Polynomial in one variable, where X is the distance along the optical axis $N = N_0 + N_1 + N_2 \ldots$ b. Polynomial in more than one variable coordinates such as $N(X_1 R) = N_0 + N_1(X)R^2 + N_2(X)R^4 \ldots$ FIG. 6 illustrates an optical product with boundary properties. The boundary property groups can be divided into two basic types:

a. Those in which the boundary of the inhomogenous index distribution is the same as the boundary of the material itself.

b. Those in which one or more boundaries of the inhomogenous media is different from the material itself, such as shown in FIG. 6 where a plano-plano element with one constant index region and two distinct inhomogenous regions. Note that the interface between the regions could be planar, spherical or arbitrary.

Figure 7:
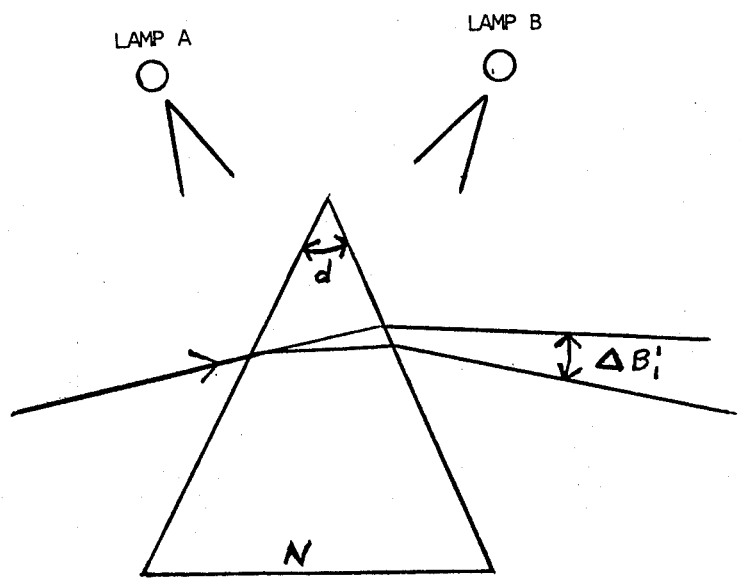
FIG. 7 is a prism with time domain optical inhomogeneities.

It is also possible to produce optical products optical inhomogeneity as a function of time, rather than space. FIG. 7 illustrates a prism of a material in which the refractive index is changed according to a photochromic effect. Such a prism can be used in a solid-state scanner, or if the prism is converted to a lens, the point of focus can be changed by the same mechanism. The deflection of the angle $\theta$ is given by the formula:

$$\Delta\theta_1' = d\Delta N$$

Thus for a value $\Delta N = 0.01$ we can get a deflection equal to one percent of the prism's apex angle d. With a 30° apex angle and a refractive index change of 0.01, the deflection is approximately ½ degree.

Figure 8:
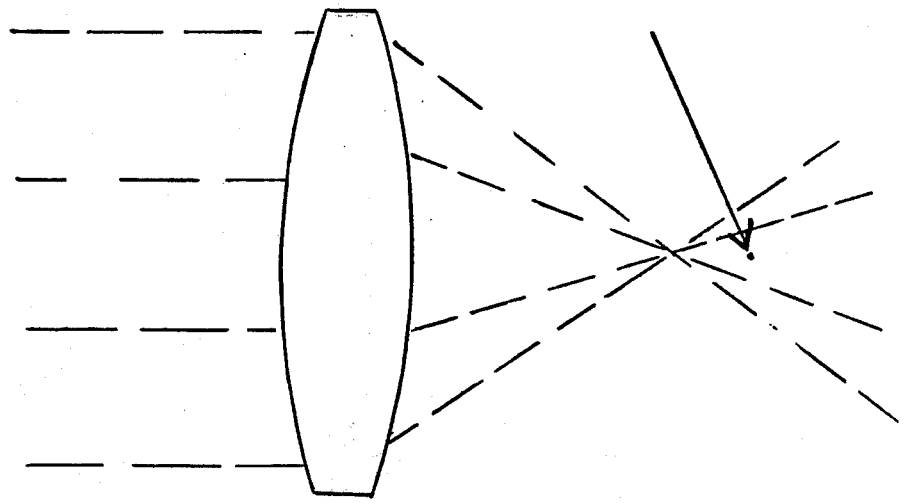
FIG. 8 is a singlet lens with index of refraction raised toward the axis.
Figure 9:
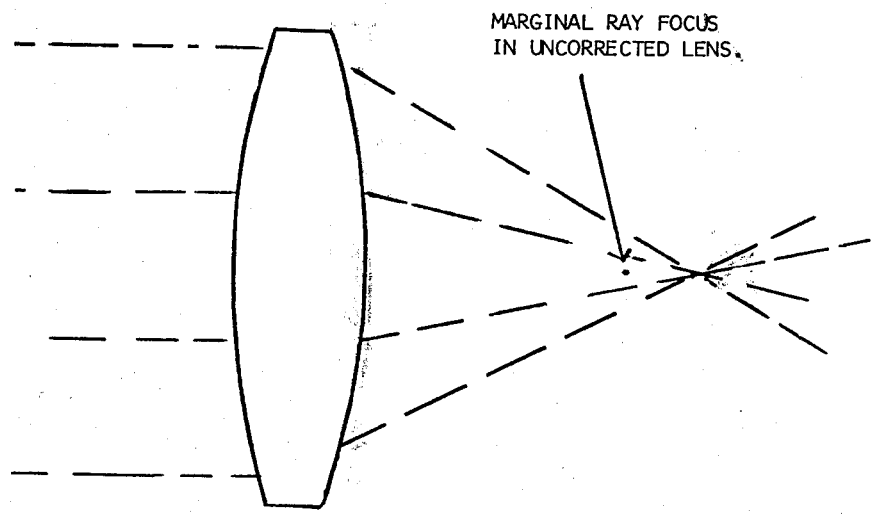
FIG. 9 is a singlet lens with index of refraction lowered toward the center.
Figure 10:
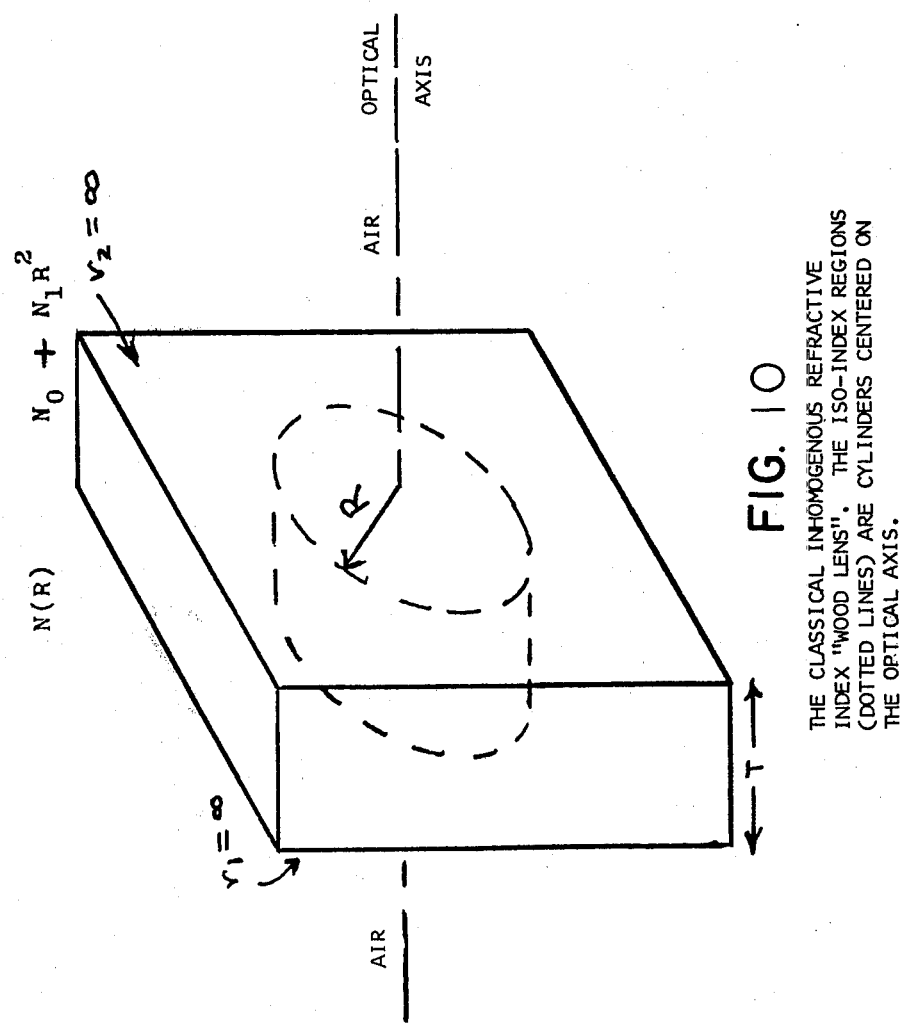
FIG. 10 is the classical inhomogeneous "Wood lens" type optical element.

FIG. 8 shows a singlet lens corrected according to the invention for spherical aberration by raising the refractive index of the original molded or ground lens in a gradient toward the center (iso-index regions are cylinders) with the result that the focus of the central rays is brought to coincide with the marginal ray focus. In FIG. 9 the invention is used to lower the refractive index in a gradient toward the margin, a process which corrects the spherical aberration by bringing marginal rays to coincide with central.

In general, radial gradients are more effective in aberration correction than axial gradients and have the greater value in lens design. One important advantage in the use of planar index distributions is the fact that construction tolerances are considerably relaxed yet good performance can be maintained. The radial distribution is most effective in modifying the refractive powers of a shaped lens (Diopter changer). In a calculation of this, where the radial gradient index is represented by a series expansion in even powers of the radial distance r from the optical axis in a cylindrical coordinate system:

$$N(r) = N_0 + N_1 r^2 + \ldots ,$$

where t is the thickness of the lens, the power of the lens is changed by the amount $-2N_1 t$. For example, a spectacle lens of 40 mm diameter and 5 mm thickness, a radial gradient index of $N_1$ equals $-0.000025$ will result in a $+1.00$ Diopter power change. This requires an index change over the face of the lens of only 0.01 in refractive index. Table 1 shows an example of the power change vs. aperture.

An important use of the invention lies in the possibility of greatly reducing the required stock of spectacle prescription blanks, bringing those to specifications and even introducing the bifocal capabilty by localized change in the refractive index.

The following is an example of an important application of the invention.

(35) The classical inhomogenous optic is the so-called "Wood lens", first described in R. W. Wood's *Physical Optics*. The Wood lens consists of a plane parallel slab-shaped optical element with index variation outward from the optical axis. A greater index at the optical axis compared to the margin yields a converging lens while the reverse yields a diverging lens.

With such a lens the condition for an image to be formed is that $N(R) = N_0 + N_1 R^2$, where R is the perpendicular distance from the optical axis (axis of rotational symmetry). If the thickness of the slab is t and $2N_1/N_0\, t$ is much smaller than unity, then the focal length of such a lens is $-1/(2N_1 t)$. More general equations for the focal length f and the back focal length Bf for a Wood lens are:

$$\frac{1}{f} = \sqrt{2N_0|N_1|}\left\{ \begin{array}{c}\sin\\-\sinh\end{array}\left(\sqrt{\frac{2|N_1|}{N_0}}\, t\right)\right\} \quad N_1 \lessgtr 0$$

$$\frac{1}{Bf} = \sqrt{2N_0|N_1|}\left\{ \begin{array}{c}\tan\\-\tanh\end{array}\left(\sqrt{\frac{2|N_1|}{N_0}}\, t\right)\right\} \quad N_1 \lessgtr 0$$

Figure 12:
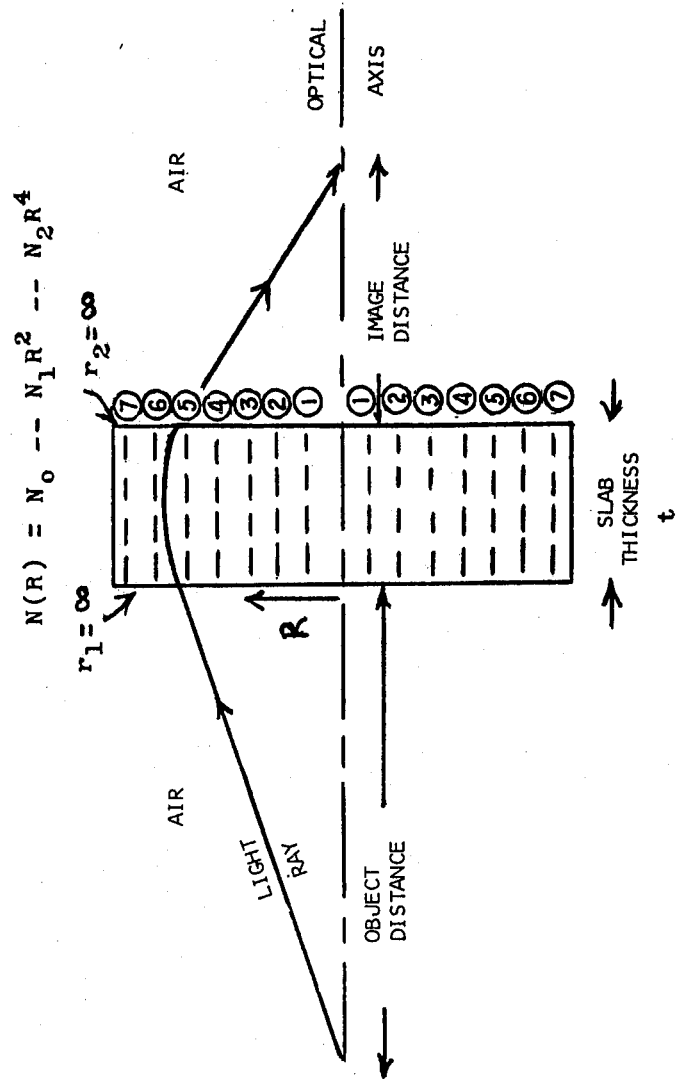
FIG. 12 is an illustration of how a generalized Wood lens corrects spherically.

An illustration of a Wood lens constructed according to the invention is given in FIG. 12, and Tables 2 and 9 give values for various combinations of focal lengths, $N_1$, and thickness. The values in Tables 2 and 9 are useful in constructing lenses according to the invention.

Although the preferred form of this invention is that in which the required energy level changes are produced by the combined action of at least two beams intersecting to provide internal placement capability for the optical inhomogeneity, a lens having the classical Wood lens characteristics as well as the other optical products can be prepared effectively be a modified placement method similar to that applied to the production of corrector plates of irregular conformation, or so-called Schmidt plates.

Figure 11:
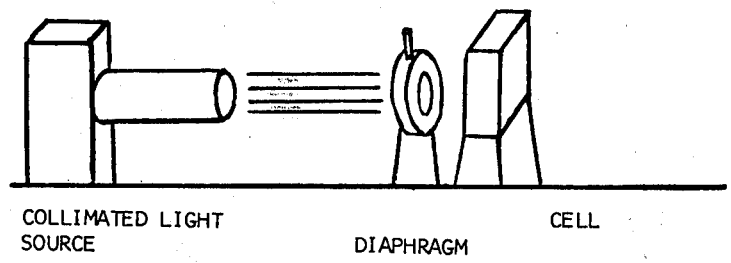
FIG. 11 is an arrangement for generating a radial gradient element.

FIG. 11 illustrates this technique. The workpiece, the lens blank of Wood-lens-to-be, is set up in a cell such as shown in FIG. 11. At the left is a source of actinic radiation, at the center is a diaphragm capable of closing down to block entirely the actinic radiation and opening continuously in a circular pattern from the center outward to the margins of the desired optical element, and at the right is the workpiece.

The workpiece is conveniently a cell prepared of two flat plates of glass or Quartz, according to the actinic radiation employed. The construction of a suitable cell is described in Example 1 of U.S. Pat. No. 3,732,097, modified so that spacing can be varied.

The working of this embodiment of the invention depends on the special formulation of the medium to include an energy transfer agent, such as a stable fluorescer, as discussed above. (It should be pointed out that where intersecting ray beams are required for some of the special internal boundary and similar inhomogenous optical elements of this invention, this embodiment is an important one because of its simplicity and utility.)

In order to make clear the advantage of this variation over the prior art, the following Example 36 is included: it is NOT an example of the present invention. Example 37 is a modification of Example 36 according to the present invention.

(36) Steps as follows:

(a) A red light source, diaphragm and cell is arranged as in FIG. 11. The cell is filled with the following solution prepared at 40° C. in the darkroom.

Gelatine 15%
Acrylamide 5%
Dimedon $1.6 \times 10^{-3}$ M
Thionine $4.0 \times 10^{-5}$ M
Water to make 100%, adjusted to pH 5.7

(b) The solution is cooled until gelled as a light blue, clear slab of gelatine within the cell.

(c) The diaghragm is closed, the red light source is turned on, and the side of the cell toward the light source is exposed to the light source over a period of 10–20 minutes while the diaphragm is gradually opened. The diaphragm is opened to the full extent only at the end of the exposure. The cell should be capped to prevent gel dehydration.

Figures 16, 19:
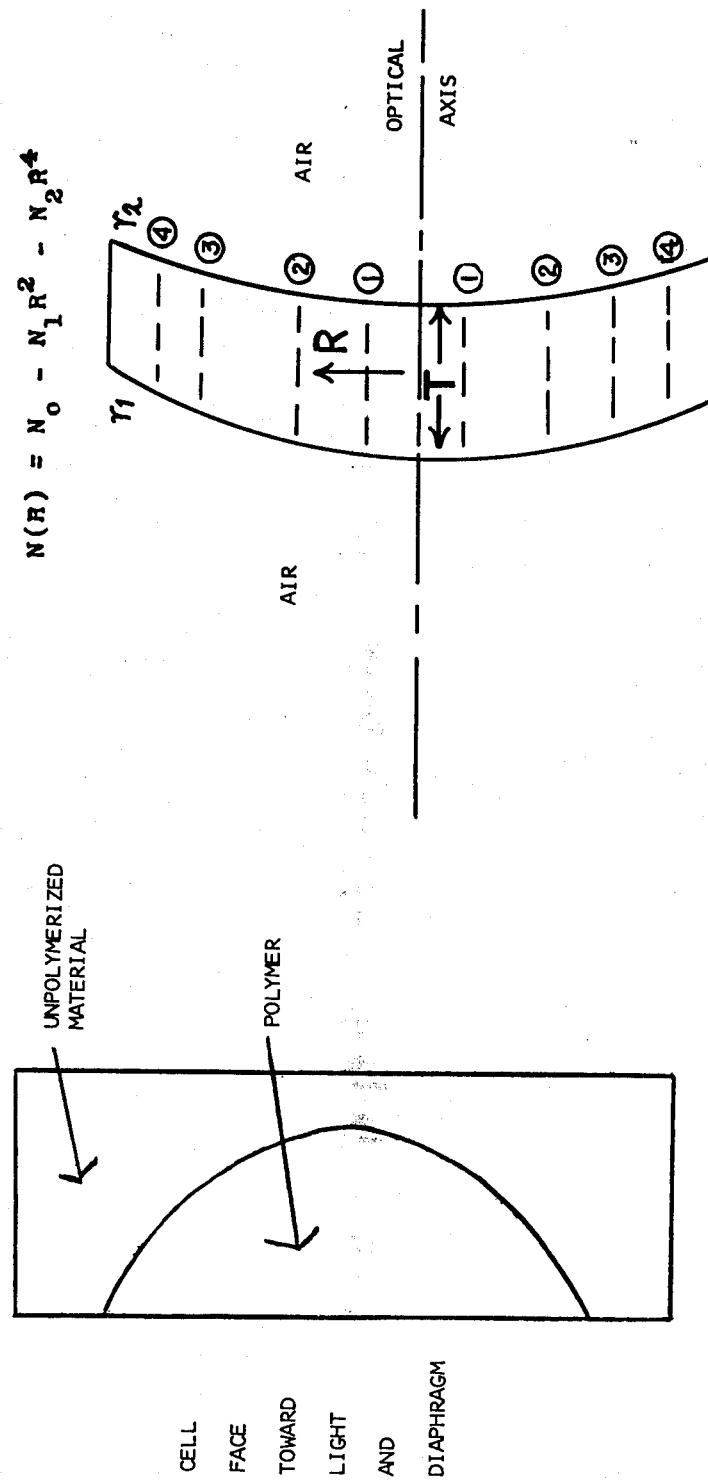
FIG. 16 illustrates an experimental apparatus not according to the invention.
FIG. 19 is a specific singlet lens with cylindrical iso-index regions.

FIG. 16 shows the result of the experiment as a side cross-section view of the cell. There has been formed a cone-shaped region of polymer-copolymer colorless material surrounded on all but one side by a region of non-polymerized and still light blue coloration. Simply, the process is that the absorption at the front of the cell producing polymerization reduces the radiation level at the rear so that the "front" of polymerization proceeds in the indicated pattern.

(37) Step (a) of Example 36 is repeated except that there is added to the solution a minute amount of an "energy transfer agent" such as discussed earlier. If, for example, the "energy transfer agent" is a fluorescer, then it will be selected from aqueous soluble fluorescent agents to conform to the following requirements.

(a) The fluorescer will be activated by light in a region not the same as the region which is absorbed by and activates the activating dye. With thionine, for example, the fluorescer will be activated by blue light around 450 nm or by ultraviolet.

(b) The fluorescence emission will be in that area f senstivity and activation for the activating dye. With Thionine, the fluorescence will be red.

(c) The fluorescer will itself activate polymerization.

In addition, the red light source of the previous example is replaced with an intense source of blue or ultraviolet light. While in Example 36 the strength of the light and the time of irradiation were related to the depth of penetration, the provision of an intense light source herein is essential to the working of the invention. The intensity of the source should be sufficient to provide a great excess of photons per cubic centimeter of the medium over molecules of absorptive "energy transfer agent".

Figure 17:
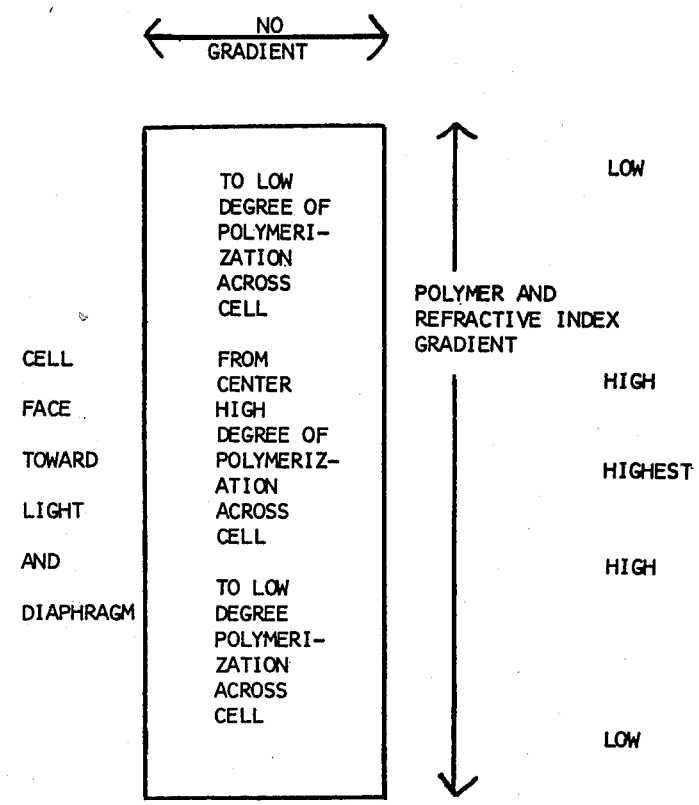
FIG. 17 illustrates an experimental apparatus operative to produce an inhomogeneous lens with radial gradient distribution according to the invention.

Exposure is carried out as in Example 36. The results are a true Wood lens as seen in FIG. 17.

The great excess of photons creates all through the thickness of the cell, from front to back, an approximately equal availability of photons to the fluorescer. The result is that all along the light path from front to back approximately equal numbers of fluorescer molecules produce approximately equal number of activating red photons which is turn activate approximately equal amounts of red-absorbing blue-dye "catalyst" for polymerization. Improved resolution (smaller travel path for red fluorescence before capture) can be obtained by increasing the proportion of "energy transfer agent".

Figure 18:
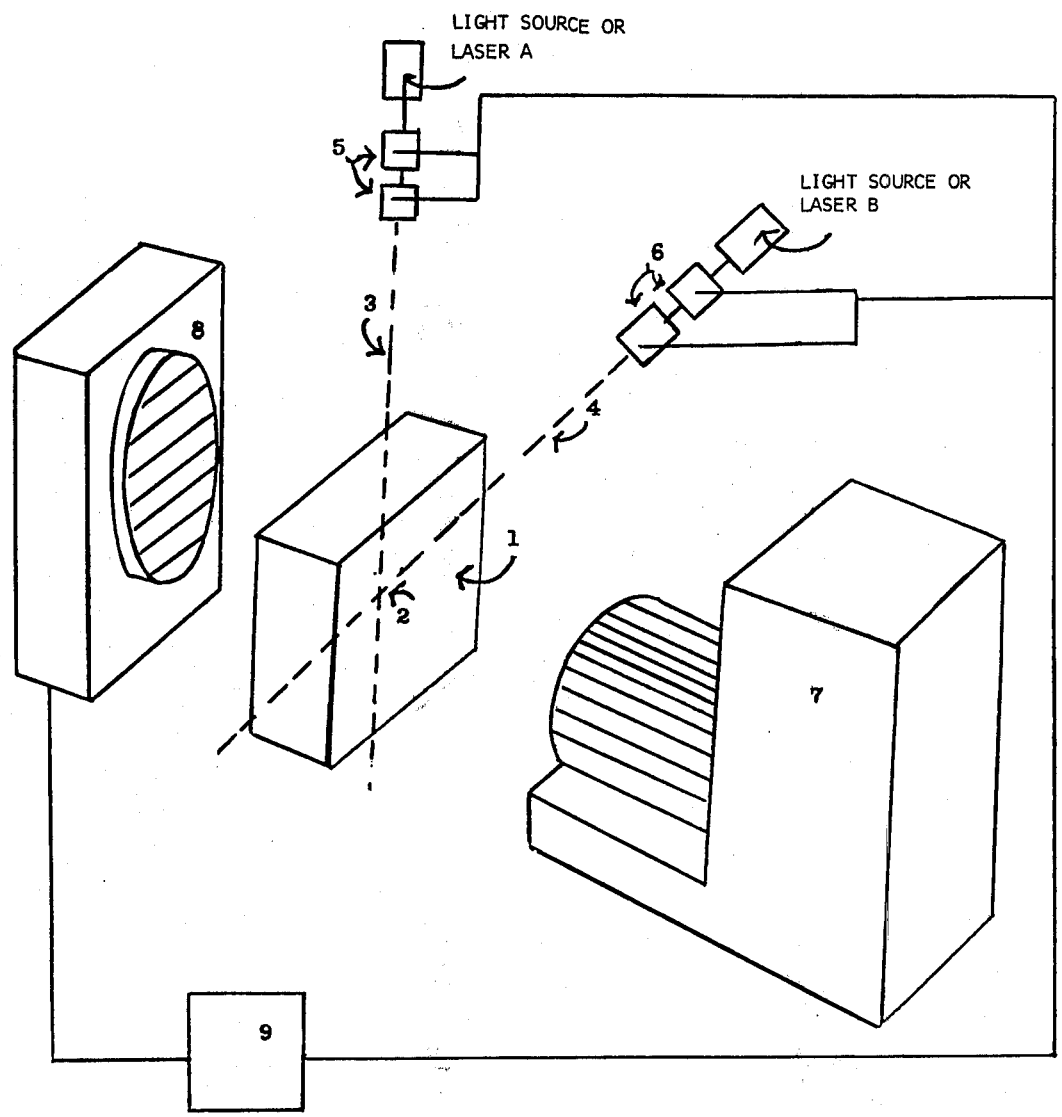
FIG. 18 is an automatic system for real time sensing and generation of optical elements according to the invention.
Figure 20:
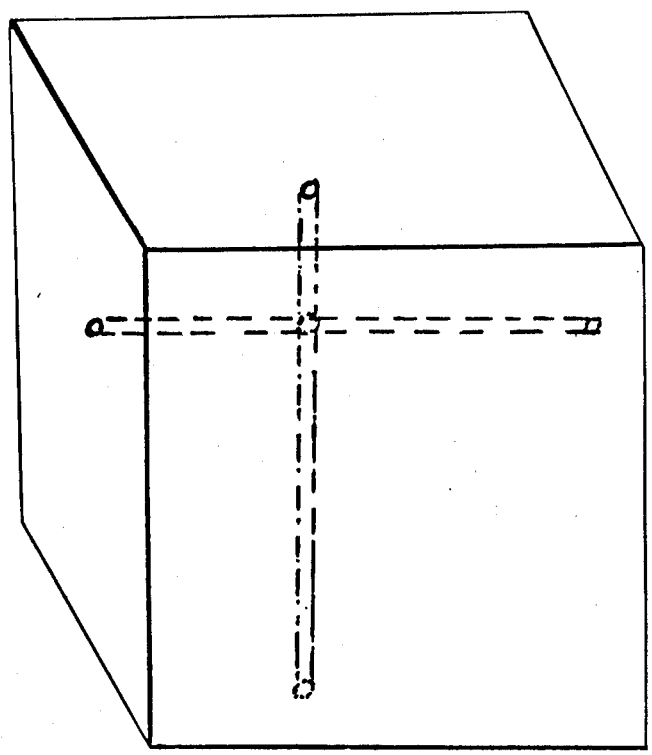
FIG. 20 is a bit placement and locating means according to one aspect of the invention.

FIG. 18 shows a generalized system for control, feedback and pattern construction according to the invention. The device includes a pattern generator light source 7, a spatial light sensor 8 coupled to a signal processor and controller or computer 9 which in turn is coupled to intensity controls and deflector mechanisms 5 and 6 for light source A and light source B, respectively. A beam 3 from source A and a beam 4 from source B are directed to a cell 1 to intersect at locus 2 to produce the desired product according to the invention.

The intensity controls and deflectors 5 and 6 can be of a variety of types (see U.S. Pat. No. 3,329,838 for construction, computational and operation details). Sensor 8 is a detector adapted to produce signals from 8 in digital form in computer 9. (The computer 9 may contain additional information as to the desired optical performance of the product 1.) Either directly or through additional computer capacity and controlling functions, the computer 9 directs the intensity controls and deflectors 5 and 6 in an appropriate way to bring the performance of the optical element to the desired specification.

An automated feedback apparatus is ideally suited to producing high-specification inhomogenous optical elements. It is, however, possible to approximate the desired characteristics in some cases to a satisfactory degree by administration of calculated radiation doses with carefully formulated preparations.

Even where a feedback aparatus is used, it is helpful to calculate behavior of the medium under specified condition of radiation flux. For a lens with symmetry of revolution where spherical aberration is to be corrected an index correction and radiation flux calculation should be made at each point of the lens as a function of the distance to the axis in order to obtain the desired correction and exposure. For an example of such calculation see Example 42.

The following are further examples illustrating construction of optical elements having optical inhomogeneities using the apparatus of FIG. 18 according to the invention.

(38) The mixture procedure of step (a) in Example 36 is repeated, using Eosine Y at a concentration of $10^{-2}$ M in place of the thionine. The generation of patterned optical inhomogeneity is carried out using a controlled ruby laser focus by the mechanism of Class I Group 2. Alternatively, two intersecting laser beams can be selected with corresponding energy properties (see Table 10) using the Class I Group 3 mechanisms, or combinations of fixed and tunable-dye lasers can be selected according to the rules discussed under Class II Group 2 mechanisms.

Multiple axis controlled systems permit patterning of the internal boundary function as well as patterned radial index distribution, as in Example 37.

(39) Prepare two solutions A and B as follows:

A. 14 gm. polyacrylamide, 2,38 gm. sodium p-toluenesulfinate dihydrate, $10^{-2}$ M Eosine Y in 100 ml. water. Heat with stirring at 60°–80° until clear blue, viscous and bubble-free.

B. 50% by weight sodium acrylate.

In the darkroom mix 2 volume parts solution A with 2 volume parts solution B and ½ volume part 37% formaldehyde solution acidified with acrylic acid. Fill cell as in Example 36 and expose as in Example 38. After exposure there is obtained a tough transparent gel with patterned optical inhomogeneity which is totally fixed and no longer light sensitive.

(40) Prepare a cell in darkroom as in Example 36 using sodium m-nitrophenylacetate at $10^{-2}$ M as a minimum concentration in 100 ml. water, 20% acrylamide, ½% methylene bis-acrylamide, and sufficient gelatine to solidify. Exposure as in Example 38 gives a similar product. The acetate can be replaced by Eosine Y and dimidor or p-toluenesulfinate.

Complex optical elements are preferably prepared using apparatus for computerized control of the exposure. Combinations of media which respond with little or no delay to the radiation states and which after response are stable are preferred for this purpose in combination with automatic feedback control. Materials may also be used which require subsequent aging or which undergo physical deformation (such as the Jenny materials) where, after inhomogeneity generation and aging, the optical element can be brought to final specifications by conventional surface shaping and polishing.

A number of testing systems for optically inhomogenous materials appear in the literature and are easily adapted to the control and feedback processes according to the invention desired. One control and feedback system is described in U.S. Pat. Nos. 3,587,195 and 3,658,528. Although the apparatus therein is designed to monitor and direct the surface shaping of an optical element, it may be modified to perform according to the present invention and particularly according to the techniques of Examples 37 through 40 and FIG. 18. Other monitoring techniques compatible with the constructing apparatus of U.S. Pat. No. 3,329,838 and useful for the purpose herein disclosed have been described.

(41) The image formed by a "Wood Lens" will not be free from aberrations. In order to form an axial image, free of third order spherical aberration, the coefficient of the next term, $N_2$, in the expansion of $N(R)$ is needed so that:

$$N(R) = N_0 - N_1 R^2 - N_2 R^2.$$

If we wish further to correct for fifth order spherical aberration an $N_3$ coefficient becomes necessary as in:

$$N(R) N_0 - N_1 R^2 - N_2 R^4 - N_2 R^6.$$

FIG. 19 illustrates a "generalized Wood Lens" with a light ray travelling from an axial object point to an axial image point. The index distribution for such a lens, is shown in Table 3, listing the results of the calculation of $N_1$ and $N_2$ such that the lens has a prescribed back focal length and is corrected for third order spherical aberration. The special value of the radial gradient inhomogenous optic is reflected in the magnitude of $N_1$: it is easily possible to manufacture a generalized "Wood Lens" of back focal length 10 cm. and radius 2 cm. according to the invention using the apparatus of FIG. 18.

Figure 13:
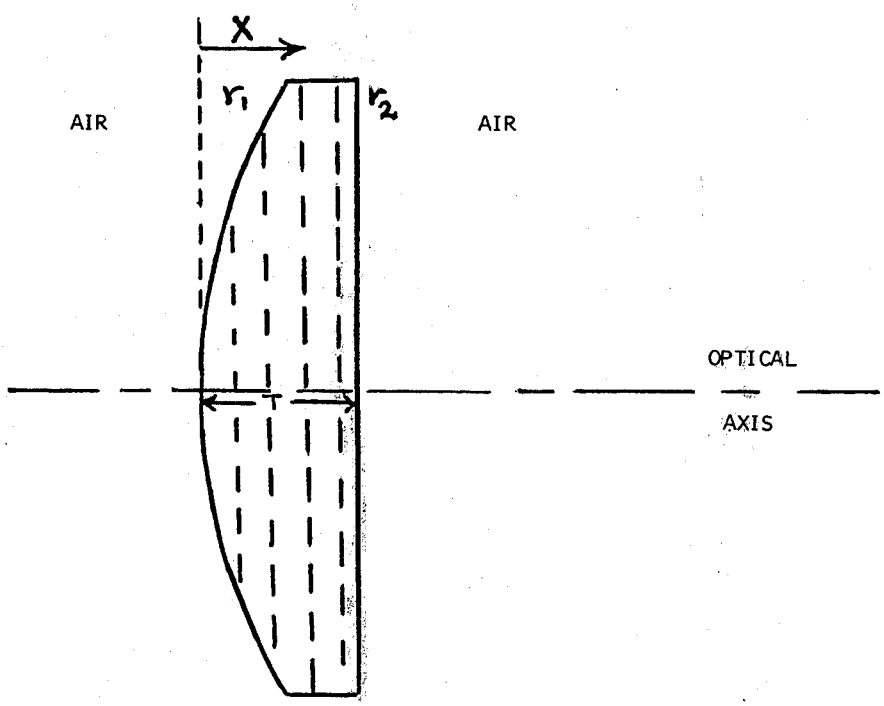
FIG. 13 is a singlet lens with planar iso-index regions perpendicular to the axis.

It is well-known that if astigmatism and Petzval curvature are present in a lens there exists a stop position such that distortion is zero. Using a planar index distribution, two spherical surfaces, and a stop, it is possible to correct third order spherical aberration, coma, and distortion. FIG. 13 illustrates such a lens. Table 4 gives the constructional data.

A corrected lens of this kind can be prepared using the apparatus of FIG. 18 and an "energy transfer agent" such as described in Example 37. The following calculations are used to determine the basic medium and irradiation requirements.

(Example 42 omitted.)

USE OF ONE EXTERNAL RADIATION STATE AND ONE INTERNAL RADIATION STATE MEDIATED BY AN "ENERGY TRANSFER AGENT"

Taking a simple case where the excess of photons over "energy transfer" molecules in the medium is at least 100/1 per cubic centimeter of medium volume and the maximum thickness of the medium is a few millimeters and the effect of the "energy transfer" is to increase polymerization and index of refraction, then the refractive index is an increasing function of the total radiation received.

This function can be generally expressed by the formula:

$$n = n_i + b\phi$$

wherein $n_i$ is the initial refractive index of the medium before irradiation, $\phi$ is the total radiation dose received at a distance h from the axis, and b is a constant. The expression can be used together with expressions describing spherical aberrations to determine desired radiation dose at distance h from the axis.

USE OF PLURALITY OF EXTERNAL RADIATION STATES COACTING WITHIN THE MEDIUM FOR CONSTRUCTION

In this mode the pattern is capable of discretionary depth placement, permitting boundary control. It is necessary to take into account intersection size and quantum efficiency factors which are similar for other types of patterns, but will be described here for the case where inhomogeneities of refractive index result from direct processes in which there is a direct relationship between polymerization (and hence refractive index increase) and relaxation from an excited state achieved by process of at least two step excitation.

Figure 14:
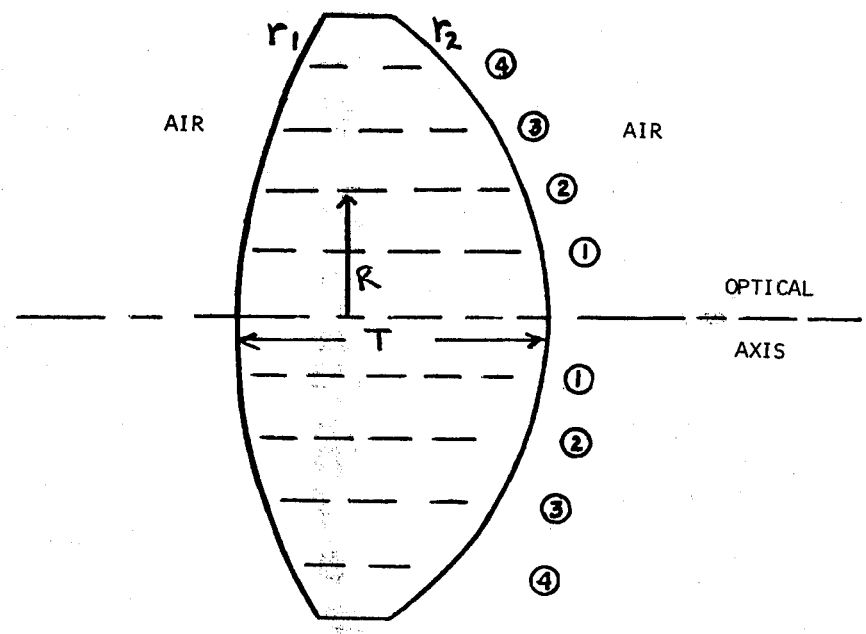
FIG. 14 is a singlet lens with cylindrical index distribution.

In the constructional mode the intersection of the radiation states will only briefly coincide with a portion of the patterned optical inhomogeneity. In this case the degree of polymerization will be a function of the efficiency of free-radical polymerization which will in turn be a function of the efficiency of the reaction process excited by the decay of the last excited state of the patterning process. All of these will be simply related and the ultimate production of optical inhomogeneity in a given portion of the medium will be a function of the expression:

$NVI_{12}I_{23}B_{12}B_{23}72 \ _{31}/M^2R$ where N is the density of excitable species, V is the beam intersection volume, $I_{12}$ and $I_{23}$ are the average beam intensities, $B_{12}$ and $B_{23}$ are the Einstein Absorption Coefficients for transitions between a first excited state and a second, then from the second to a third, respectively by $h\nu_1$ and $h\nu_2$, $\eta_{31}$ is the quantum efficiency for polymerization per transition from the third excited state to the lowest state, M is the number of locations addressed R times per second, and it has been assumed that in each of the R times a location is addressed, pumping is effected by a single pair of temporally spaced pulses in the sequence $h\nu_1$ followed by $h\nu_2$ such that the time from the beginning of the $h\nu_1$ pulse to the end of the $h\nu_2$ pulse is much shorter than the lifetime of the second level of excitation. It is evident that for maximum efficiency it is desirable to maximize the expression $B_{12}B_{23}\eta_{31}$. (43) The radial distribution gradient is illustrated by FIG. 14, a singlet with a radial gradient of the form used in the generalized Wood lens:

$$N(Y)=N_0+N_1R^2+N_2R^4.$$

Constructional data is given in Table 5. Three aberrations (spherical, coma, and astigmatism) are corrected by suitable choice of the curvatures, thickness, and values of $N_1$ and $N_2$, while distortion is corrected by shifting the stop. The Petzval field curvature is uncorrected. This lens is free of all third order aberrations except Petzval curvature.

The focal length of a singlet with a radial gradient is given by the formula:

$$\frac{1}{f} = \left\{ \begin{array}{c} \cos(kt) \\ \cosh(kt) \end{array} \right\} (N_0 - 1)(C_0 - C_1) +$$

$$\left\{ \begin{array}{c} \sin(kt) \\ \sinh(kt) \end{array} \right\} \frac{(N_0 - 1)^2}{kN_0} C_0C_1 +$$

$$\sqrt{2N_0|N_1|} \left\{ \begin{array}{c} \sin(kt) \\ -\sinh(kt) \end{array} \right\} , N_1 \begin{array}{c} < \\ > \end{array} 0$$

where f is the focal length, $C_0$ is the first surface curvature, $C_1$ is the second surface curvature, t is the central thickness, the index function is $$N(R)=N_0+N_1R^2+N_2R^4+\ldots,$$

and $$k = \sqrt{\frac{2|N_1|}{N_0}}$$

For values $(kt)^2 < <$ this equation can be approximated by $$\frac{1}{f} = \frac{1 - 2N_1 f_0 t}{f_0}$$

where $$\frac{1}{f} = (N_0 - 1)(C_0 - C_1) + \frac{t(N_0 - 1)^2}{N_0} C_0C_1$$

Figure 15:
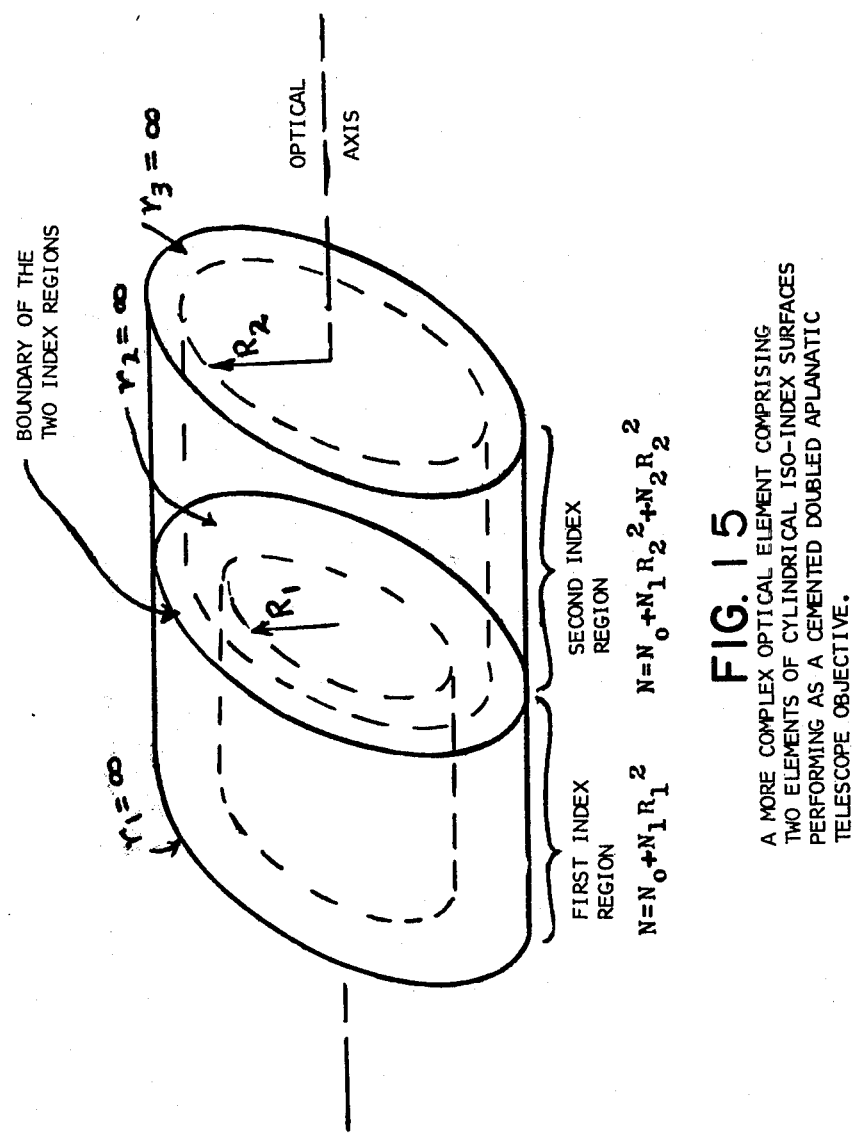
FIG. 15 is a complex optical element function operative as a doubled aplanatic telescope objective.

(44) A more complex optical element is shown in FIG. 15, where two elements of unitary thickness and cylindrical iso-index surfaces are combined to provide an aplanatic telescope objective. The capability of generating this telescope doublet within a single block of material directly is unique to the present invention.

The two aberrations to be corrected are spherical aberration and coma. The lens constructional data for this corrected lens is found in Table 6.

(45) A lens at f/6.3 is illustrated in FIG. 19, a singlet with cylindrical index distribution. It has approximately the same spherical aberration, coma, tangential and sagittal field curvature as a homogenous f/11 singlet photographic lens. The half-field angle is 25°, the aberrations being total rather than third order. This lens has an index difference of −0.008 between the center and the margin of the lens. Table 7 gives the constructional data of this lens. A second lens at f/11 with all aberrations greatly reduced from homogeneous f/11 photographic singlets has its constructional data listed in Table 8.

VOLUME COMPUTER MEMORY SYSTEM

The present invention includes applications as a volume computer memory. Particular active materials capable of fluorescence, such as anthracene, are disposed within an addressable three-dimensional matrix. Programming or data storage is carried out by causing the molecules of the active materials between two stable ground state conditions of monomer and dimer using the Class I and Class II mechanisms herein described. The materials should have the properties such as a controllable capability and incapability to produce a fluorescent reaction in each of the stable states at the location representing the programmed bit to provide binary state indication. The state of a bit can be detected by subjecting it to radiation which produces fluorescence in one of the states. No prolongation of the molecular excited states is necessary to detect the binary state. After reading the fluorescent bit returns to a stable ground state which is not the same as the other stable ground state molecule condition prior to programming.

The present invention permits the use of a whole range of new memory materials rather than the special crystalline materials or cryogenic conditions of prior art. Virtually any photochemical transformation at selected bit locations will produce differences in absorption at the programmed locations. The state can be detected by the means described in U.S. Pat. Nos. 3,715,734; 3,654,626; or 3,940,748 (see also Geller and Taylor in their report No. NELC/TR 1749 from the Naval Electronics Laboratory Center, *Three-Dimensional Information Storage in Alkali Halides by Two-Photon Absorption*, issued 4 Jan. 1971). Likewise, stimulated emission and fluorescent bit elements can be read with the advantages of the detection system of U.S. Pat. No. 3,508,208 or the like. Unlike crystalline materials, perfect memory matrices of any desired size in amorphous materials can be fabricated with high quality optical properties.

Although the bit-array form of the invention is preferred, the possibility of using the principles of the invention to synthesize volume holographic memory exists.

An important aspect of the efficiency of some embodiments wherein light emission takes place or light conduction is required to place radiation within the memory, are various means of vector determination and control. For example, by optically isolating regions wherein fluorescence occurs it becomes possible to treat these regions separately and conduct parallel operations in different parts of the memory.

Mention may also be made of the capability of in situ generated fibre optics in permitting selective distribution or memory sectioning both by direction (where they go), and by filtering (by wavelength selective carrying capacity). Means adaptive to optical isolation are described in Applied Optics, Jan. 1965, vol. 4, p. 143.

Another technique for memory sectioning useful alone or in combination with the above is temporal rather than spatial. Modern electronic technique permits millions of events per second to be examined individually over time and distinguished from one another. See, for example, Rev. Sci. Instr., vol. 40, No. 9, Sept. 1969, p. 1199 for an early example of such a device.

The filtering capacity of in-situ generated waveguides and a variety of other characteristics of integrated optics systems can be incorporated in efficient embodiments of the invention. Circuit fundamentals have been described in Bell Systems Technical Journal, vol. 48, p. 2071 et. seq. Filters, directional couplers, and even lasing devices (see previous example using polymethine dyes) can be prepared.

A useful compilation of data regarding one-photon energy requirements of a large group of switchable materials has been compiled by Tufte and Chen (IEEE Spectrum, Feb. 1973, vol. 10, p. 26). This reference and those cited therein provide useful information on both switchable materials and on the matrix materials within which they can be incorporated while retaining switchability, for the purposes of this invention.

Because of the sensitivity of instrumentation to light emission, a preferred embodiment of this invention utilizes memory patterns read by processes generating such light emission in programmed bit positions, or variable qualities of such light emission as in wavelength for example, as the bit store. Examples 25, 27, 29 and 32 describe preferred materials for this purpose. The properties of suitable materials are well described, for example dimers (Applied Optics, vol. 11, Mar. 1972, p. 533, Nature, Mar. 16, 1963, vol. 197, p. 1064, and Analytical Chemistry, vol. 45, Dec. 1973, p. 2446). The last gives valuable matrix information and details of the absorption and reactivity patterns of n-amyl anthroate. Lasing properties of remade dimers are discussed in Applied Physics Letter, vol. 20, 1 Feb. 1972, p. 139. Other particularly known and useful materials have been referred to in Example 32. Properties of light emission and stability in plastic matrix make the materials described in U.S. Pat. No. 3,899,687 particularly attractive.

A last group of preferred materials are the indigo dye derivatives, particularly the thioindigo and diacetylindigo materials described in Journ. or Phys. Chem., vol. 72, August 1968, p. 2817 and in Journ. Amer. Chem. Soc., vol. 79, May 20, 1957, p. 2464. These materials were used in the Examples 27 and 29 herein. Table 11 shows some examples of regions of one-photon reactivity for some of these materials effective in converting non-fluorescent to fluorescent forms, the one-photon fluorescence-inducing radiation, and the fluorescence emission region. The materials capable of reversible cis-trans isomerization are particularly suitable for reprogrammable light-emitting memories. A number of useful mechanisms for switching the cis-trans ratio efficiently are discussed in Organic Photochemistry, p. 20–23, including "optical pumping" and the use of sensitizers which will selectively cause one or the other isomer to predominate.

While the preferred patterning mechanisms of the invention employ visible light radiations, combinations with other optical radiations are also possible. A large group of inorganic phosphate glasses become fluorescent under short UV radiation or particulate radiation. See J. H. Schulman, "Survey of Luminescence Dosimetry", in *Luminescence Dosimetry*, F. H. Attix. Ed. U.S. Atomic Energy Commission, Division of Technical Information, Oak Ridge, Tenn. 1967, p. 3-33. A large proportion of materials used in particulate dosimetry with the production of fluorescent products will also respond to the two-photon energy equivalents of short ultraviolet radiation, and are useable in the invention. Similarly, dosimetry materials which produce color or opacity changes have been described in A. Charlesby, *Atomic Radiation and Polymers*, Pergamon Press, N.Y. 1960, p. 101–7.

While many of the materials used in the invention have been bi-polar with a ground state and an excited state, it is possible to exploit bi-polarities of upper level excitation states for very fast computer memories. For example, vibrational cascade mechanisms operate on the order of $10^{-9}$ to $10^{-12}$ seconds and internal conversion mechanisms operate on the order of $10^{-13}$ to $10^{-14}$ seconds, as compared with fluorescence processes on the order of $10^{-5}$ to $10^{-9}$ seconds. See U.S. Pat. No. 3,341,825 for further details.

Use of the same beams in both reading and writing is of particular value in computer memories according to the invention because of the increase in accuracy of bit location and relocation due to the cancelling out of minor optical imperfection effects when the same optics are used for the different operations. Where different beams or combinations of different system groups are used recourse may be had to reference bits of known placement.

One embodiment of the computer memory invention can be seen in FIG. 23 wherein a first beam source 27 is a high intensity source and a second beam source 25 is a tunable laser source. In operation, the memory is programmed by any of the Class I Group 3 or Class II mechanisms using appropriate combinations of beams 32 and 34 intersecting at a bit 23 causing formation of a fluorescent-capable isomer. The memory is read by again intersecting the high intensity beam with a retuned high-energy beam so as to match the two-photon absorptions band for fluorescence emission. In this simple case a photodetector 31 detects or does not detect emission depending on the state of the bit location. Working from a given two-photon pattern a ruby laser combined with tuning in the range 400 nm to 600 nm at 25 nm intervals provides nine two-photon absorption energies to match with the activation patterns of the material. using a Nd-YAG laser and tuning between 550 nm and 900 nm provides fifteen others as shown in FIG. 21. Continuous dye laser tuning using diffraction gratings, dispersing prisms, tunable etalons, birefringent filters, and the like, allows selective concentration in bands as small as 1 nm, and stacked tuning elements provide bands of 0.01 nm or less. This permits systems to be designed which are highly selective while still using only two beams, permitting multiple operations such as fibre-optic circuit components generation, memory programming and reading, and the other operations herein disclosed in a single matrix. Use of sensitizers where a selected material does not happen to have a convenient two-photon absorption greatly increases system design options as described earlier and use of focused radiation states further enhances them.

It is evident that the photodetector 31 in FIG. 23 can be replaced by a variety of direction sensitive detectors, such as earlier described, to permit separate portions of the memory to be operated independently and thereby increase capacity. U.S. Pat. No. 3,829,838 contains a wealth of information on energy sources, beam control, and placement mechanisms which together with other references shows that the state of the art in these areas makes their description here unnecessary.

The invention has now been described in such terms to allow the skilled artisan to employ the teachings. It is not intended that the invention be limited in scope except as indicated by the appended claims interpreted in view of this Specification.

We claim:

1. An optical element having inhomogeneity of refractive index which is constructed by directing into a photoreactant substantially dispersed in a fluid medium a first optical beam at a first wavelength which is matched to a characteristic spectral absorption region of said photoreactant, and directing a second optical beam of a second wavelength matched to a characteristic spectral absorption region of said photoreactant such that the first optical beam and the second optical beam intersect to generate a mono-molecular reaction in the region of beam intersection to generate a substantially persistent change in refractive inex in said region, said first and second optical beams being translatable to produce within said medium a controlled refractive index distribution useful for performing an optical function determined by a pattern of said distribution.

2. The optical element of claim 1 wherein said optical beams are operative to control boundary properties of said optical distribution pattern.

3. The optical element of claim 1 wherein said optical beams are operative to control the rate of change properties of said distribution pattern.

4. An optical element according to claim 1 wherein said optical beams are operative to control radial gradient type symmetry properties of said optical distribution pattern.

5. An optical element according to claim 1 wherein said optical beams are operative to control axial type symmetry properties of said distribution pattern.

6. A three-dimensional volume computer memory system comprising a substantially transparent morphically stable dispersion fluid medium containable within a volume and including therein a photoresponsive material confined in the transparent fluid medium, a molecule of said material being responsive to first optical radiation emitted at a first selected spectral region to excite an electron to an excited state and also being responsive to second optical radiation emitted in a second selected spectral region to generate a chemical reaction at said molecule, such that said molecule is responsive to the confluence and absorption of first and second radiations to exhibit a substantially changed chemical state, the response of said material to one of said radiations being insufficient to generate said chemical reaction, means for directing a first optical beam of a first wavelength matched to said first characteristic spectral absorption region of said material, and means for directing a second optical beam of a second wavelength matched to said second characteristic spectral absorption region of said material such that at a common reaction site of said first beam and said second beam a substantially persistent chemical reaction occurs which is sensible as representing a selected binary state.

7. A three-dimensional volume computer memory system comprising a volume of memory medium according to claim 6, and further including means for optically sensing said changes at identifiable locations within said memory medium.

8. A computer memory system as claimed in claim 7 wherein said sensing means is responsive to said changes through differences in absorption patterns resulting from a change in an excitation state of said memory medium as compared to a reference level of absorption.

9. A computer memory system as claimed in claim 7 wherein said sensing means is responsive to light emission at said identifiable locations.

10. A computer memory system as claimed in claim 7 wherein said memory medium comprises interconvertible isooxazoles, azirenes and oxazoles.

11. A computer memory system as claimed in claim 7 wherein said memory medium comprises reactants utilizing cis-trans isomerization processes.

* * * * *